United States Patent
Hyobu et al.

(10) Patent No.: US 6,474,474 B2
(45) Date of Patent: *Nov. 5, 2002

(54) SHEET SUPPORT CONTAINER

(75) Inventors: Yukihiro Hyobu, Tokyo (JP); Yasunori Oka, Saga-ken (JP)

(73) Assignees: Sumitomo Metal Industries, Ltd. (JP); Kakizaki Manufacturing Co., Ltd. (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/381,460

(22) PCT Filed: Feb. 6, 1998

(86) PCT No.: PCT/JP98/00489

§ 371 (c)(1),
(2), (4) Date: Sep. 21, 1999

(87) PCT Pub. No.: WO99/39994

PCT Pub. Date: Dec. 8, 1999

(65) Prior Publication Data

US 2001/0040116 A1 Nov. 15, 2001

(51) Int. Cl.⁷ ............................................. B65D 85/30
(52) U.S. Cl. ..................... 206/711; 206/710; 206/454
(58) Field of Search ............................. 206/710, 711, 206/454, 1.5, 832

(56) References Cited

U.S. PATENT DOCUMENTS

| | | | | |
|---|---|---|---|---|
| 4,981,222 A | * | 1/1991 | Lee | 206/454 |
| 5,228,568 A | * | 7/1993 | Ogino et al. | 206/711 |
| 5,255,797 A | * | 10/1993 | Kos | 206/711 |
| 5,284,802 A | * | 2/1994 | Muraoka et al. | 206/710 |
| 5,575,394 A | * | 11/1996 | Nyseth | 206/454 |
| 5,704,494 A | * | 1/1998 | Nishikiori et al. | 206/454 |
| 5,711,427 A | * | 1/1998 | Nyseth | 206/710 |
| 5,725,100 A | * | 3/1998 | Yamada | 206/710 |
| 5,782,362 A | * | 7/1998 | Ohori | 206/454 |
| 5,788,082 A | * | 8/1998 | Nyseth | 206/710 |
| 5,858,103 A | * | 1/1999 | Nakajima et al. | 206/832 |
| 5,873,468 A | * | 2/1999 | Ejima et al. | 206/454 |
| 6,032,802 A | * | 3/2000 | Ejima et al. | 206/711 |

FOREIGN PATENT DOCUMENTS

| | | |
|---|---|---|
| JP | 4728405 | 12/1972 |
| JP | 220042 | 1/1990 |
| JP | 4303941 | 10/1992 |
| JP | 62699 | 1/1994 |
| JP | 7307380 | 11/1995 |
| JP | 964161 | 3/1997 |
| JP | 9107026 | 4/1997 |
| JP | 9139421 | 5/1997 |
| JP | 9301401 | 11/1997 |

* cited by examiner

Primary Examiner—M. D. Patterson
Assistant Examiner—Troy Arnold
(74) Attorney, Agent, or Firm—Lorusso & Loud

(57) ABSTRACT

The present invention relates to a thin-plate supporting container 1 having a container body 2, and a thin-plate supporting unit 3 for supporting the semiconductor wafers from both sides thereof in the container body. There are provided a lid 4, and an easy attach/detach mechanism for attaching and detaching the lid 4. The easy attach/detach mechanism 31 is composed of a lid engaging claw 32 provided on the circumference of the lid 4, and object engagement part 28, provided on the container body 2, for engaging with the lid engagement claw 32 so as to secure the lid 4 to the container body 2, an arm 34 for releasing the lid engagement claw 32 from the object engagement part 28; and an elevating mechanism for slightly elevating the lid 4 from the container body 2 when the lid engagement claw 32 is released by means of the arm 34. The thin-plate supporting unit 3, the top flange 5, the carrying handle 6 are detachably mounted. The thin-plate supporting unit 3 is formed with a V-shaped groove 38. For the container 1 to be easily stacked, there are provided leg 18 and a leg receiving part 30. Thereby, the operations of attaching and detaching the lid 4 and the operation of washing the whole container are made easy.

21 Claims, 21 Drawing Sheets

SHEET SUPPORT CONTAINER

TECHNICAL FIELD

The present invention relates to a thin-plate supporting container designed for the housing, storage and transportation of thin plates, such as semiconductor wafers, storage disks, liquid crystal glass substrates, and the like.

BACKGROUND ART

As an example of a conventional container having an easily attachable/detachable lid, the container disclosed in the Japanese Utility Model Publication No. Hei 6-13114 (No. 13114/1994) entitled "Engagement Mechanism in Sealed Container" is known.

Referring to FIGS. 2 through 4, the sealed container 51 generally includes a container body 52, and a lid 53 for covering an open top of the container body 52. Each of opposing side walls of the lid 53 is provided with an engagement piece 54 extending downward. Each engagement piece 54 has an operational hole 55 formed at the center thereof, and engagement apertures 56 formed at the both sides of the operational hole 55. In the container body 52, there are provided engagement elements 57 which engage with the engagement apertures 56 formed in the engagement piece 54. Each engagement element 57 has an inclined surface 57A which slidably contacts with and spreads outwardly the engagement piece 54.

In the above construction, when the lid 53 is placed on the container body 52 and pressed downward from above, the engagement piece 54 slidably contacts with the inclined surface 57A and is spread outwardly, so that the engagement elements 57 engage with their corresponding engagement apertures 56. Thereby, the lid 53 is attached to the container body 52 so that they are securely fastened to each other.

When the lid 53 is removed from the container body 52, the engagement pieces 54 are bent. Specifically, the operator inserts his hands into the operational holes 55 of the two engagement pieces 54 and bends the engagement pieces 54 in directions in which the pieces 54 are pulled away from each other (toward the right in FIG. 4) so as to disengage the engagement apertures 56 of the engagement pieces 54 from their corresponding engagement elements 57. Thereafter, the lid 53 is removed from the container body 52.

In the interior of the container body 52, there may be provided thin-plate supporting units (not shown) which are formed as an integral part of an inner surface of the container body 52 and adapted to support at a predetermined spacing a plurality of semiconductor wafers housed in the container body 52, or there may be housed a wafer carrier serving as a separate member.

Meanwhile, when the lid 53 is removed from the container body 52, the two engagement pieces 54 must be bent in directions in which the pieces 54 are pulled away from each other so as to disengage the engagement apertures 56 of the engagement piece 54 from their corresponding engagement elements 57.

However, such operations are difficult to perform. This is because in the operation of lifting the lid 53 upward while bending the two engagement pieces 54 in directions in which the pieces 54 are pulled away from each other, the operator must perform an operation of pulling the engagement pieces 54 away from each other and an operation of lifting the lid 53 upward at the same time.

Further, due to complexity of these operations, it has been difficult to automate these operations by means of transfer equipment.

Further, when the sealed container needs to be washed after use, if the container is of a type in which the thin-plate supporting unit is integrally formed in the container body 52, washing the sealed container is not an easy task. Specifically, since the thin-plate supporting unit has a plurality of narrow slots for receiving the thin plates, besides being formed in the interior of the sealed container, it is difficult to wash the sealed container to an extent that the innermost portions of the slots are thoroughly washed. This problem also arises in the case of a wafer carrier.

The present invention is accomplished in view of the above-mentioned problems. An object of the present invention is to provide a thin-plate supporting container in which the operations of attaching and detaching the lid and the operation of washing the container are simplified.

Disclosure of Invention

A thin-plate supporting container according to a first aspect of the invention is characterized in that there are provided a container body for housing therein a plurality of thin plates; and thin-plate supporting units, provided on opposing side walls of the container body, for supporting the thin plates thus housed from their both sides, wherein there are provided: a lid for covering the container body; and an easy attach/detach mechanism for causing the lid to be attached to and detached from the container body, the easy attach/detach mechanism including:

an engagement part provided at a circumferential portion of the lid;

an object engagement part which is provided on the container body in such a manner as to oppose the engagement part and adapted to engage with the engagement part so as to secure the lid to the container body;

an arm which is provided integrally with the engagement part of the lid and adapted to release the engagement part from the object engagement part when the arm is pressed; and an elevating mechanism for slightly elevating the lid from the container body when the engagement part is released from the object engagement part by means of the arm.

In this construction, when the lid is attached to the container body, the container body is placed in an upright position with its open top directed upward, and the open top is covered with the lid, and then the lid is pressed from above. Thereby, the engagement part of the easy attach/detach mechanism engages with the object engagement part, so that the lid is secured to the container body. When the lid is removed, the arm is pressed down ward. Thereby, the engagement part disengages from the object engagement part, so that the lid having been secured to the container body is released therefrom, whereby the lid is slightly elevated by means of the elevating mechanism. As a result, the lid is released from the container body. Thereafter, the lid is lifted manually by the operator, or automatically by the transfer equipment.

The thin-plate supporting container according to a second aspect of the present invention is characterized in that, in the thin-plate supporting container of the first aspect of the present invention, there are provided:

a leg, provided at the lower portion of the container body, for stably supporting the container body placed in an upright position; and a leg receiving part, formed on the upper surface of the lid, for receiving the leg.

In this construction, when the thin-plate supporting container is placed in an upright position, the leg of the container body abutting contacts with the placement surface so that the thin-plate supporting container is supported in a stable manner. When a plurality of thin-plate supporting containers are stacked in a plurality of decks, the leg of the container body fits into the leg receiving part formed on the upper surface of the lid. Thereby, a plurality of thin-plate supporting container are stacked in a stable manner.

A thin-plate supporting container according to a third aspect of the present invention is characterized in that there are provided a container body for housing therein a plurality of thin plates; and thin-plate supporting units, provided on opposing side walls of the container body, for supporting the thin plates thus housed from their both sides, wherein the thin-plate supporting unit is detachably mounted to the container body.

In this construction, when the thin-plate supporting unit, which is detachably mounted to the container body, is detached, the thin-plate supporting unit and the container body can be washed easily and sufficiently to every small portion thereof.

Further, in this construction, the operator can previously prepare, with respect to the thin-plate supporting unit, a plurality of types in which the number of thin plates to be supported, the spacing between the thin plates to be housed, and the distance between the two thin-plate supporting units oppositely provided are appropriately varied, and can select an appropriate type suitable for the dimension, the number, and the other features of the thin plates to be housed. Thus, the operator can easily and swiftly cope with various situations where the container is used.

The thin-plate supporting container according to a fourth aspect of the present invention is characterized in that, in the thin-plate supporting container according to the third aspect of the present invention, each of the thin-plate supporting units includes:
a plurality of ribs which are provided in parallel at a predetermined spacing, and adapted to support the plurality of thin plates individually;
supporting bars which are integrally connected to and whereby support the ribs, which are in the state that are provided in parallel at a predetermined spacing, at least at an innermost position and at an inlet-side position;
V-shaped groove each of which is formed on an abutting contact surface of the supporting bar of the innermost position, the abutting contact surface serving to abutting contact with the thin plate, and adapted to guide, when the container body is placed in an upright position, the thin plate to the center between the ribs so as to support the thin plate at the innermost position.

In this construction, each thin plate is inserted between neighboring ribs of the thin-plate supporting unit. When the thin-plate supporting container is placed in a horizontal position and its open top is directed sideward, each thin plate is placed on and supported by each rib. When the thin-plate supporting container is placed in an upright position, each thin plate is mainly placed on and supported by the region of the thin plate near the innermost supporting bar. Specifically, since a V-shaped groove is formed at the region of the rib near the innermost supporting bar, the inserted thin plate is guided by the inclined surface of the V-shaped groove to fall into the bottom of the groove, so that the thin plate is supported by the innermost supporting bar region of the thin plate while being situated at the position intermediate between neighboring ribs. The upper portions of individual thin plates are supported by the upper portions of each rib. Accordingly, the thin plates are prevented from interfering with each other.

The thin-plate supporting container according to a fifth aspect of the present invention is characterized in that, in the thin-plate supporting container according to the fourth aspect of the present invention, the thin plate is disk-shaped, and the rib is formed in the shape of a circular arc along the circumference of the disk-shaped thin plate, the thin plate and the rib overlapping each other at a small area along the circumference of the thin plate.

In this construction, when the individual disk-shaped thin plates are inserted between neighboring ribs of the thin-plate supporting unit, each rib supports each thin plate along the circumferential edge of the thin plate in such a manner that the rib and the thin plate contact with each other at a small area. Thereby, the area in which the rib and the thin plate overlap each other is reduced, so that rib is prevented from adversely affecting the surface of the thin plate. Specifically, the synthetic resin forming the rib generates a trace amount of gas. However, the rib and the thin plate overlap each other at a small area, and therefore the gas thus generated rarely contacts the surfaces of the thin plates. Thereby, the adverse effect caused by the gas and applied to the surfaces of the thin plates are reduced to the smallest extent.

Further, as the area in which the ribs overlap each other seen from the direction perpendicular to the flats of the ribs is reduced, the dust or the like that adheres on the surfaces of the ribs is also reduced, and moreover washing of the ribs becomes easy.

A thin-plate supporting container according to a sixth aspect of the present invention is characterized in that, in the thin-plate supporting container according to the third aspect of the present invention, the thin-plate supporting units are made of a synthetic resin which is excellent in formability and can be finished at a high precision in dimension.

In this construction, the thin plates are securely supported by thin-plate supporting unit having high dimensional precision, and interference between neighboring thin plates is prevented from occurring. Examples of the synthetic resin forming the thin-plate supporting unit includes PBT (polybutylene terephthalate), PEEK (polyetheretherketone), PBN (polybutylene naphthalate), and the like.

A thin-plate supporting container according to a seventh aspect of the present invention is characterized in that, in the thin-plate supporting container according to the first aspect of the present invention, a top flange to be gripped by the arm of transfer equipment, and a carrying handle are detachably attached to the container body.

In this construction, when the thin-plate supporting container is used, the top flange and the carrying handle are attached so that the container can be transported automatically by the transfer equipment or manually carried by the operator. When the thin-plate container is transported, the top flange and the carrying handle are detached and packed in a compact size.

A thin-plate supporting container according to an eighth aspect of the present invention, is characterized in that, in the thin-plate supporting container according to the seventh aspect of the present invention, the carrying handle is attached in such an inclined position as to be oriented in the direction intermediate between the vertical and horizontal directions of the container body.

In this construction, when the operator changes the position of the thin-plate container body from an upright position to a horizontal position, or from a horizontal position to an upright position, with the handle in his hand, he does not need to turn his wrist to an extreme extent, so that operability of the container is enhanced.

A thin-plate supporting container according to a ninth aspect of the present invention characterized in that, in the thin-plate supporting container according to the first aspect of the present invention, wherein there is provided a filter, provided on either one of the container body and the lid, for allowing gas to pass therethrough so as to equalize the internal and external pressures while inhibiting dust or the like from passing therethrough.

In this construction, when the container is transported by plane and the atmospheric pressure around the container changes greatly, the filter allows gas to pass therethrough between the inside and outside of the thin-plate container so that the internal atmospheric pressure of the container is always kept to the same value. In other words, the internal atmospheric pressure of the container is adjusted to its optimum value while preventing dust or the like from entering the thin-plate supporting container and keeping the internal air clean. Thereby, the lid is prevented from becoming difficult to open.

Further, since the lid is detachably attached, when the thin-plate supporting container is washed, the filter can be detached and washing the container can be performed in an efficient manner.

BEST MODE FOR CARRYING OUT THE INVENTION

Figure 1:
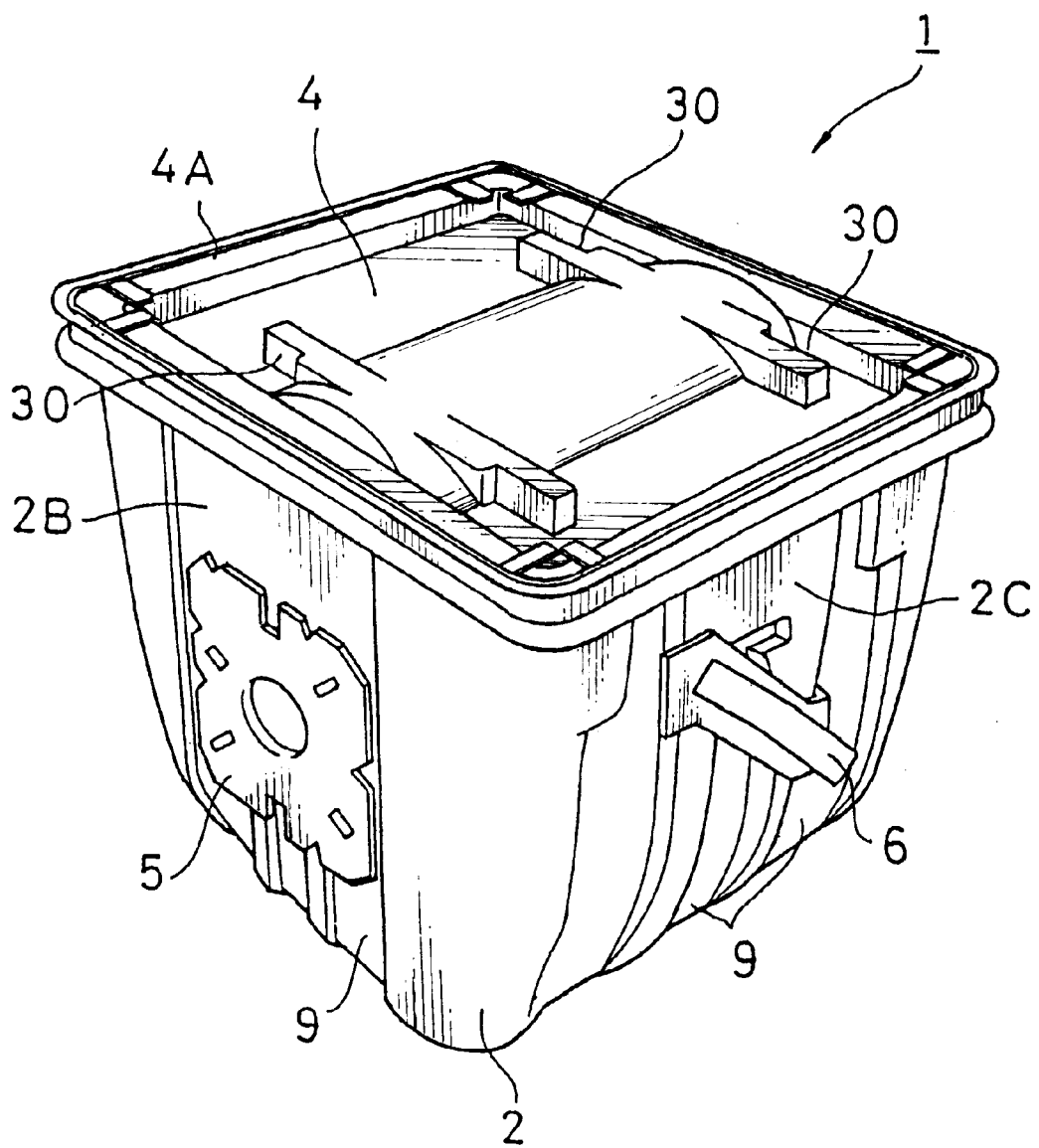
FIG. 1 is a perspective view showing a thin-plate supporting container 1 according to an embodiment of the present invention.
Figure 2:
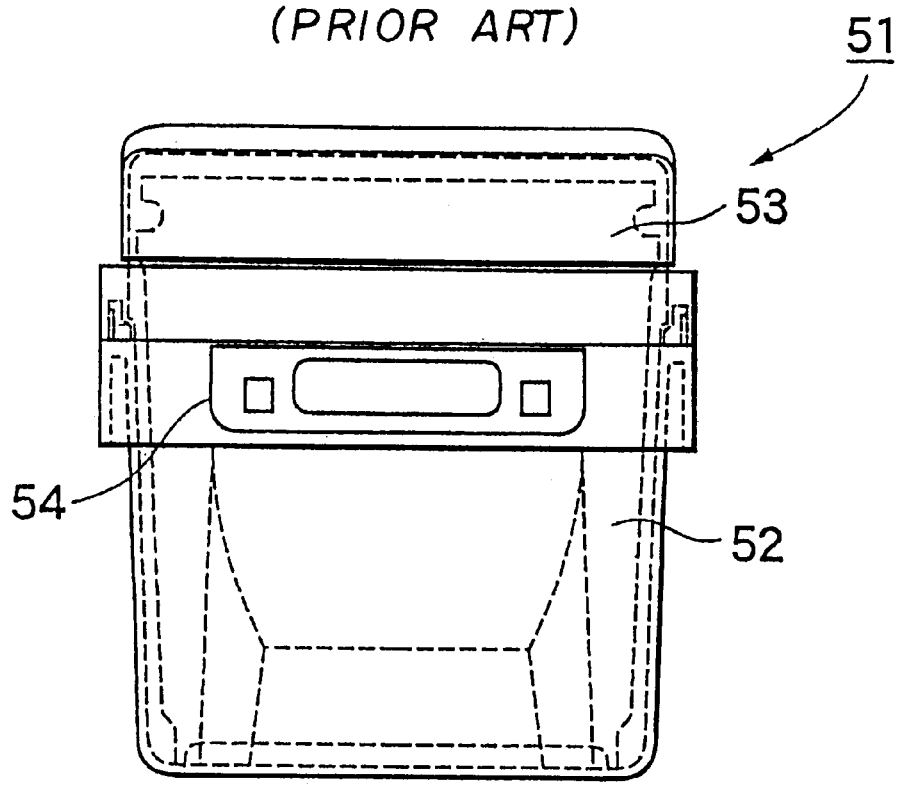
FIG. 2 is a side view of a conventional sealed container.
Figure 3:
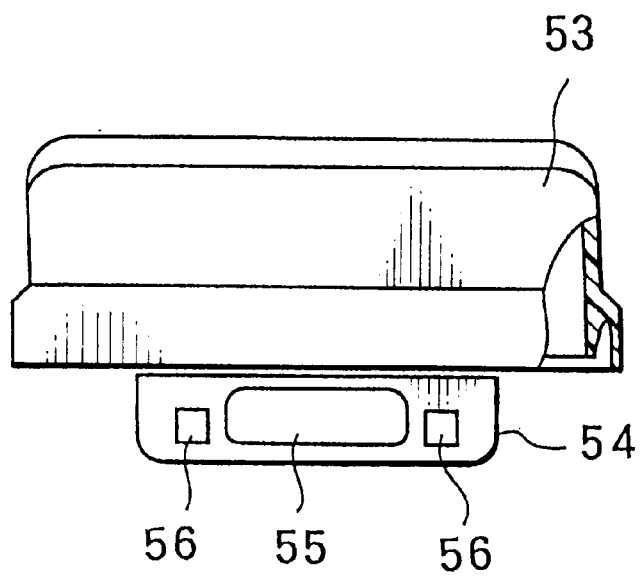
FIG. 3 is a side view of a lid of the conventional sealed container.
Figure 4:
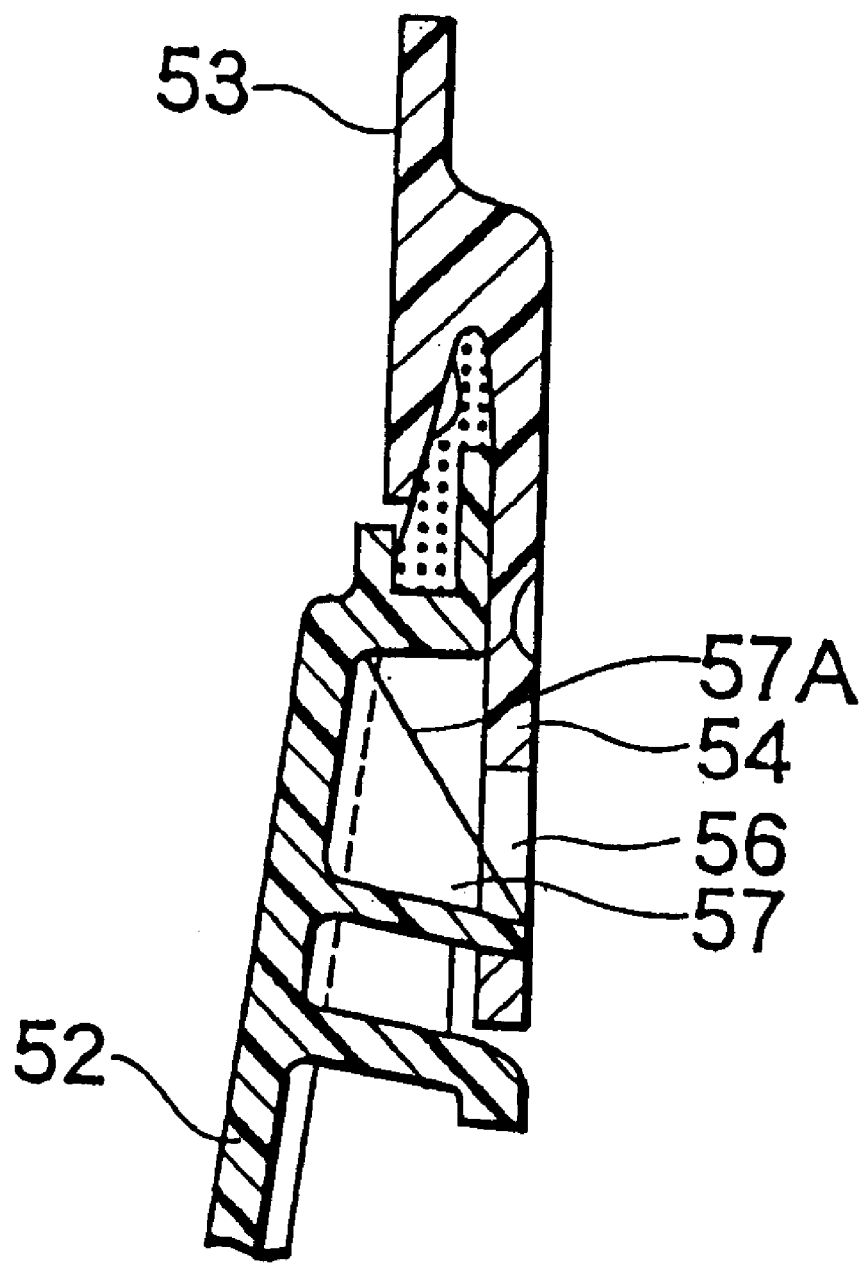
FIG. 4 is a sectional view showing a main portion of a conventional mechanism for securing the lid to the conventional sealed container.

Hereinafter, embodiments of the present invention will be described referring to the attached drawings. The thin-plate supporting container of the present invention is preferably used as a container designed for the housing, storage and transportation of thin plates, such as semiconductor wafers, storage disks, liquid crystal glass substrates, and the like. In this embodiment, the thin-plate supporting container of the present invention will be described by employing as an example a thin-plate supporting container for housing semiconductor wafers.

Referring to FIG. 1 and FIGS. 5 through 12, the thin-plate supporting container 1 according to the present embodiment 1 includes: a container body 2 for housing therein a plurality of semiconductor wafers (not shown); two thin-plate supporting units 3, each provided on each of the opposing side walls of the container body 2, for supporting the semiconductor wafers housed in the container body 2 from the both sides of the wafers; a lid 4 for covering an open top 2F of the container body 2; a top flange 5 which is supported by an arm of the transfer equipment (not shown); a carrying handle 6 which is gripped by a hand of the operator when he carries the container 1 with his hands; and a filter 7 (see FIG. 34) for adjusting internal atmospheric pressure of the thin-plate supporting container 1.

Figure 5:
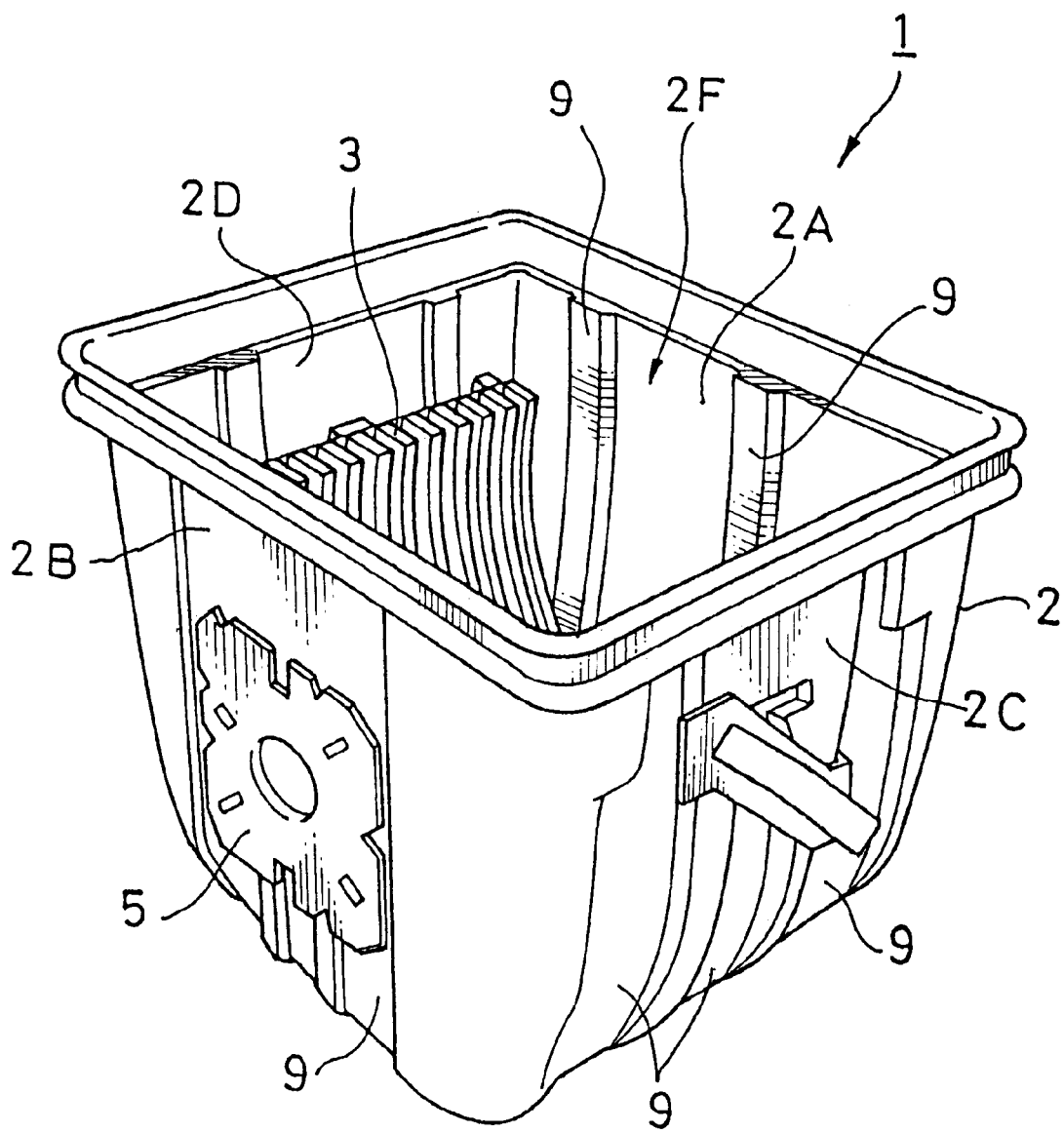
FIG. 5 is a perspective view showing the thin-plate supporting container according to the embodiment of the present invention in a state in which the lid is removed.
Figure 6:
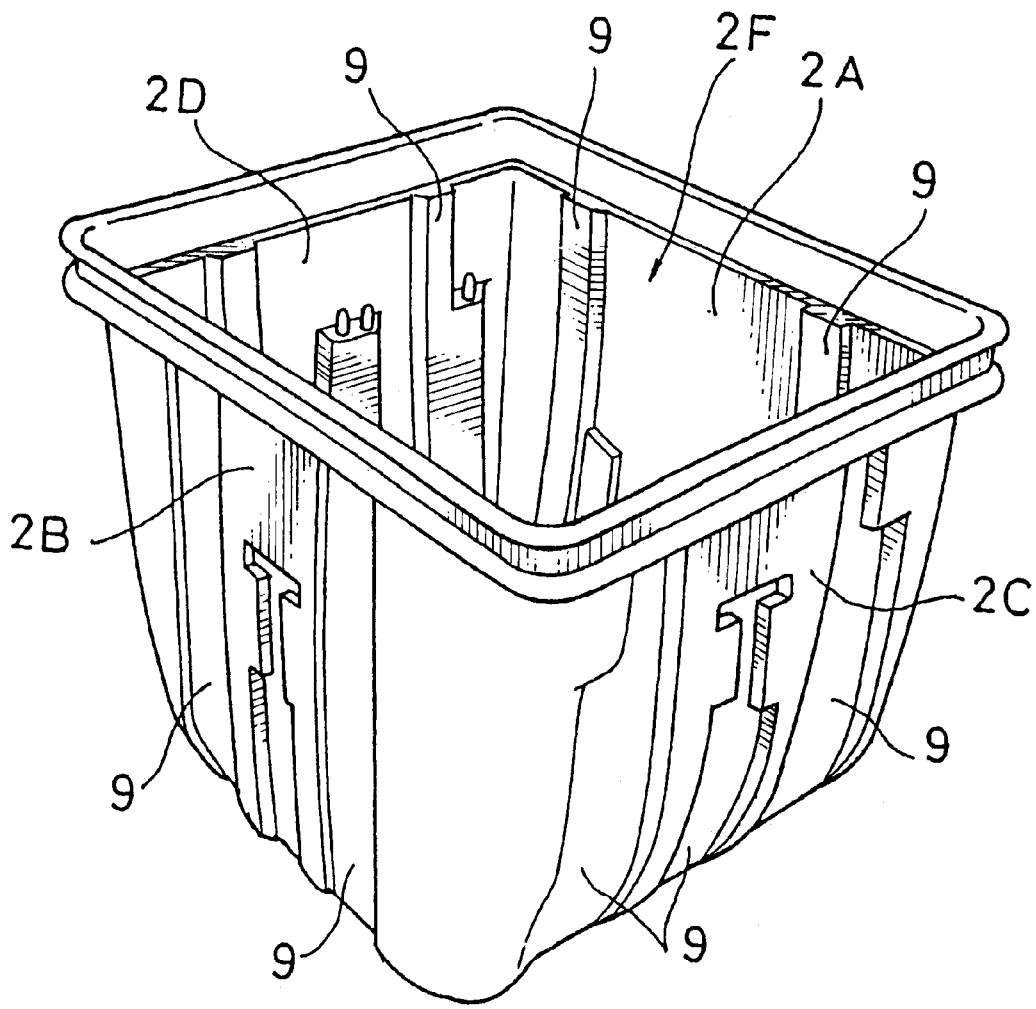
FIG. 6 is a perspective view showing the thin-plate supporting container according to the embodiment of the present invention in a state in which the lid and thin-plate supporting unit are removed.

The container body 2 is formed substantially in the shape of a cube as a whole, as shown in FIGS. 1, 5 and 6. The container body 2 has, in an upright position (i.e. in the state shown in FIGS. 1, 5 and 6), four side walls 2A, 2B, 2C and 2D serving as circumferential walls, and a bottom plate 2E (see FIG. 10), and has an open top 2F. Each of the side walls 2A, 2B, 2C and 2D is formed with a plurality of vertical gutters 9 for a reinforcement purpose. The container body 2 is placed in a horizontal position when the container body 2 is placed opposite to a wafer transferring robot (not shown) in a semiconductor wafer manufacturing line or the like. The side wall 2A, which serves as a bottom plate when the container body 2 is placed in a horizontal position, is provided, on its outside surface, with positioning means 11 (see FIG. 7) for positioning the thin-plate supporting container 1. The side wall 2B, which serves as a top plate when the container body 2 is placed in a horizontal position, is attached, on its outside surface, with a top flange 5 detachably mounted. Each of the side walls 2C and 2D, which serves as a side plate when the container body 2 is placed in a horizontal position, is attached, on its outer surface, with a carrying handle 6 detachably mounted.

Figure 7:
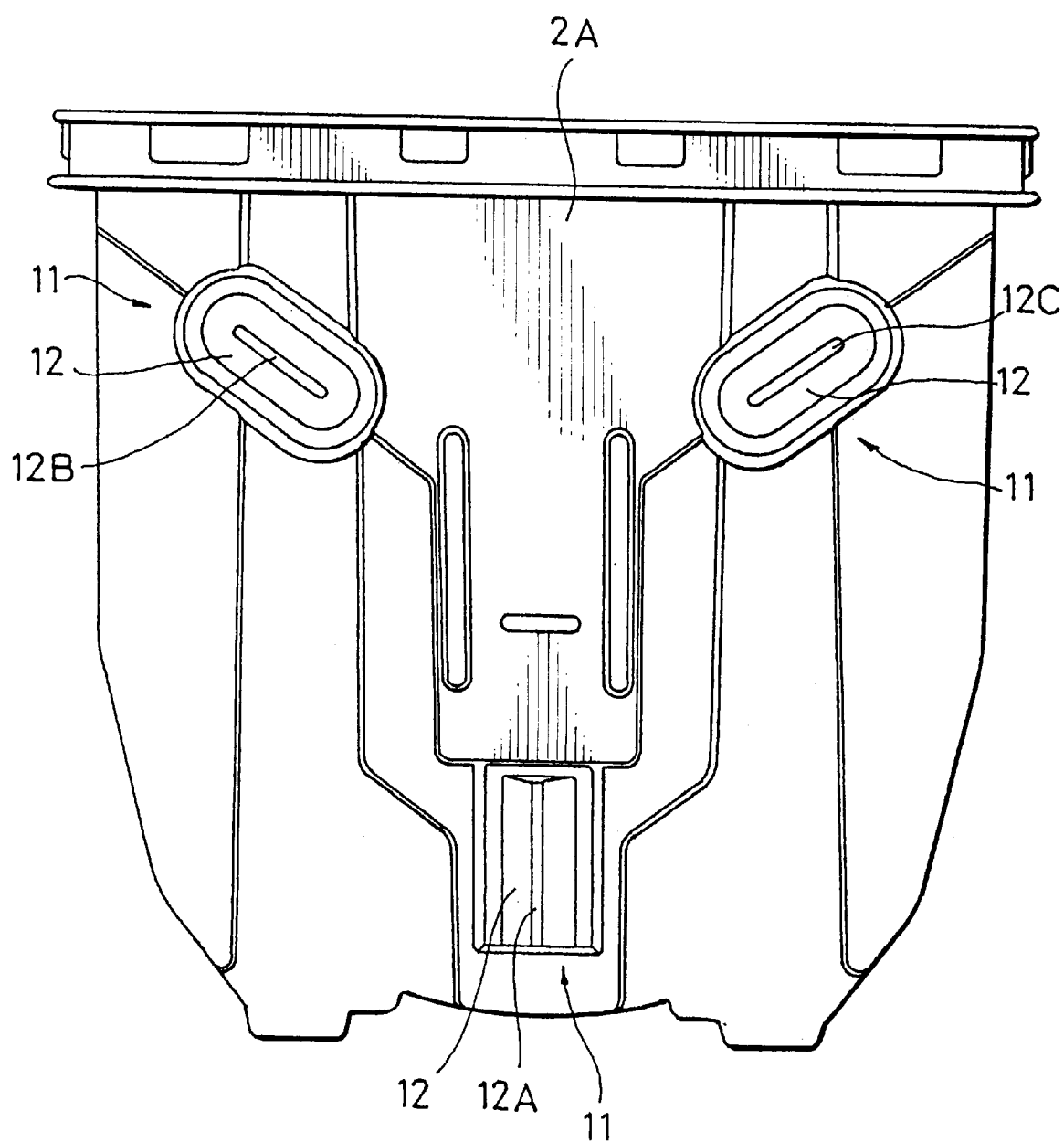
FIG. 7 is an elevational view of container body according to the embodiment of the present invention.

The side wall 2A is constructed as shown in FIG. 7. Specifically, the wall 2A is provided, on its entire surface, with positioning means 11. The positioning means 11 is composed mainly of three engagement grooves 12. The engagement grooves 12 include a first engagement groove 12A which aligns with the vertical direction of the container body 2, and a second groove and a third groove both of which are inclined at the same angle (approximately 60 degrees) to the vertical direction of the container body 2. The three engagement grooves 12a, 12B and 12C are finished at high precision to meet its standard requirement. When the engagement grooves 12A, 12B and 12C of the positioning means 11 engage with their corresponding protrusions (not shown) provided on a placement table, the thin-plate supporting container 1 is set at an accurate position, so that the semiconductor wafers can be taken in and out by the wafer transferring robot.

Figure 8:
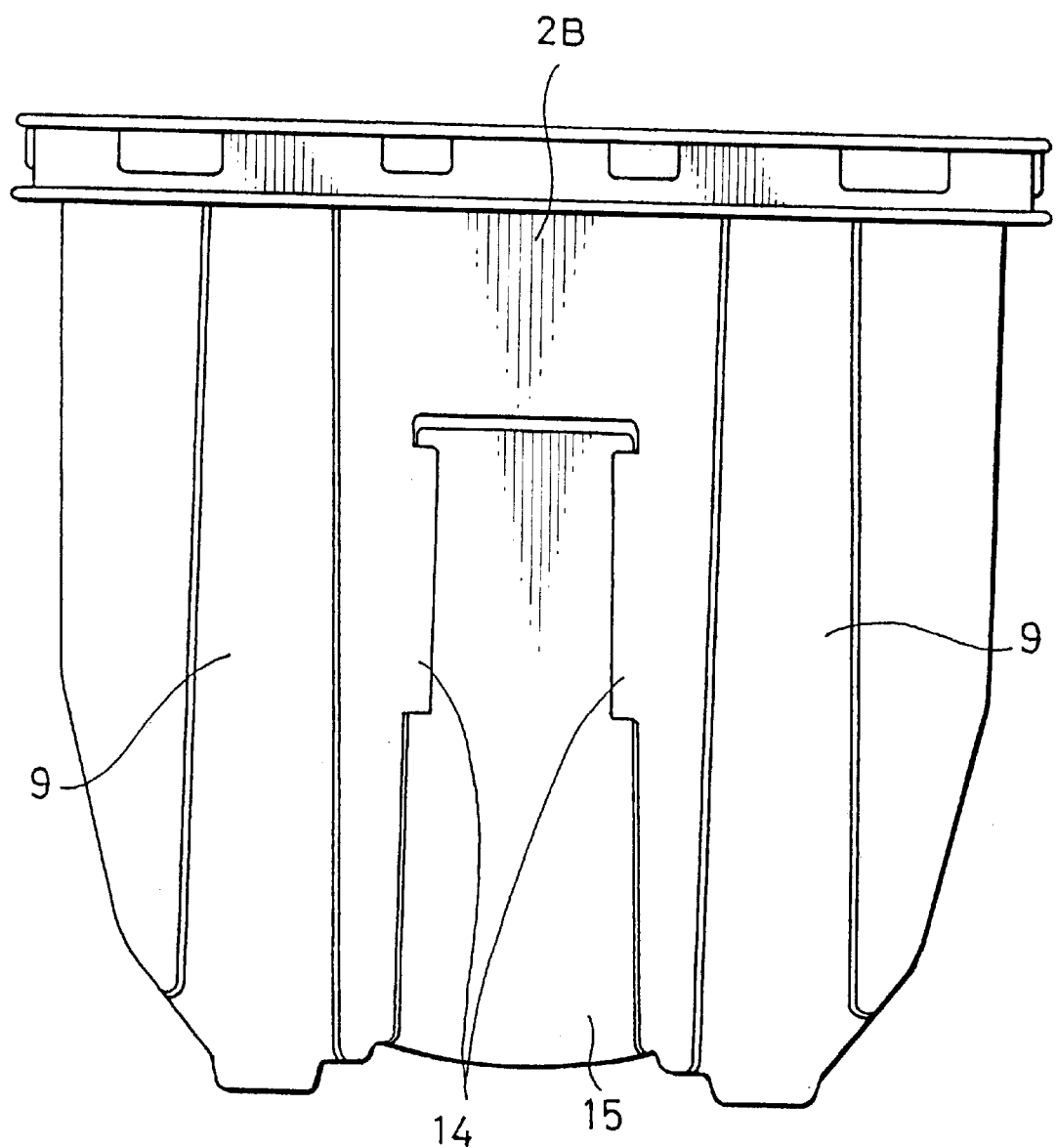
FIG. 8 is a rear elevational view of the container body according to the embodiment of the present invention.

The side wall 2B is constructed as shown in FIG. 8. At the central portion of the side wall 2B, there are provided flange attaching plates 14 between which a top flange 5 is detachably attached. The flange attaching plates 14 are provided at a flange engagement groove 15. The flange engagement groove 15 is formed by recessing the side wall 2B at is central portion situated between the vertical gutters 9, which extend along the side edges of the side wall 2B, from its bottom edge up to the vicinity of its upper edge. The flange attaching plates 14 are composed of two plates both of which are provided at the upper portion of the flange engagement groove 15 and each of which extends inwardly from each side edge of the flange engagement groove 15. The top flange 5 is inserted, from bottom in FIG. 8, between the two flange attaching plates 14 and thereby attached thereto.

Figure 9:
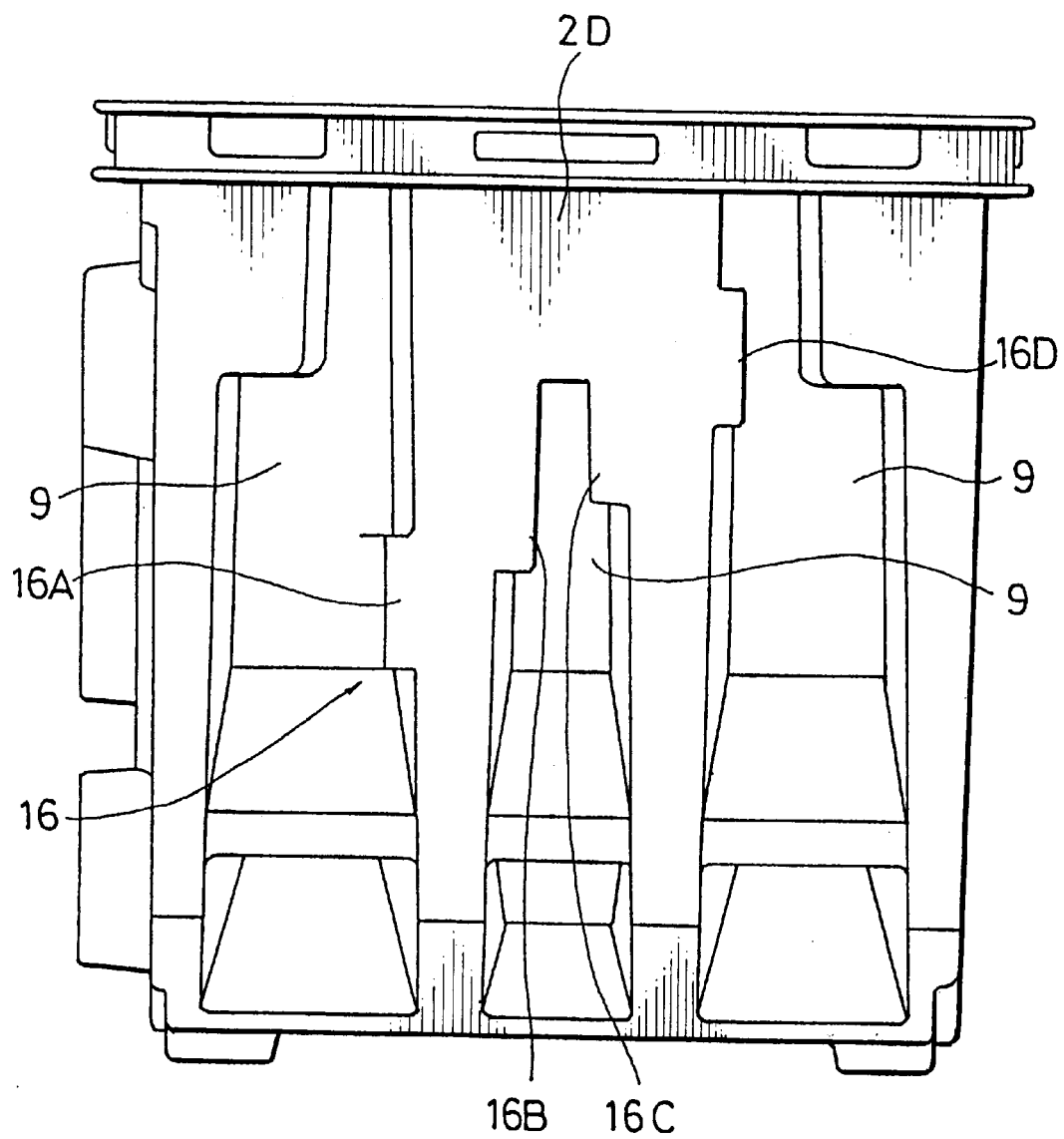
FIG. 9 is a side view of the container body according to the embodiment of the present invention.

The side walls 2C and 2D are constructed as shown in FIG. 9. FIG. 9 shows only the side wall 2D because the side walls 2C and 2D are symmetrically provided. In the side wall 2D, there is provided a handle attachment plate 16, to which the carrying handle 6 is detachably attached. The handle attachment plate 16 includes four plate pieces 16A, 16B, 16C and 16D, all of which are provided in the side wall 2D. The plate piece 16A extends inwardly (i.e. leftward) from the right side edge of the left vertical gutter 9, which is one of the three vertical gutters 9 provided in the side wall 2D. The plate piece 16A is situated at the lowest position of all the plate pieces 16A through 16D. Each of the plate pieces 16B and 16C extends inwardly from each edge of the central vertical gutter 9. The plate piece 16B, which extends from the left edge of the central gutter 9, is provided at a position lower than that of the plate piece 16C, which extends from the right edge of the central gutter 9. The plate piece 16D extends inwardly from the left side edge of the right vertical gutter 9. The plate piece 16D is situated at the highest position of all the plate pieces 16A through 16D. Thus, the plate pieces 16A, 16B, 16C and 16D are arranged in an upper right direction at 45 degrees to the horizontal line. The carrying handle 6 is detachably attached to the plate pieces 16A, 16B, 16C and 16D in such a way that the handle 6 is inclined at 45 degrees to the container body 2.

In the side wall 2C, there is also provided a handle attachment plate whose structure is symmetrical to that of the handle attachment plate provided in the side wall 2D.

Figure 10:
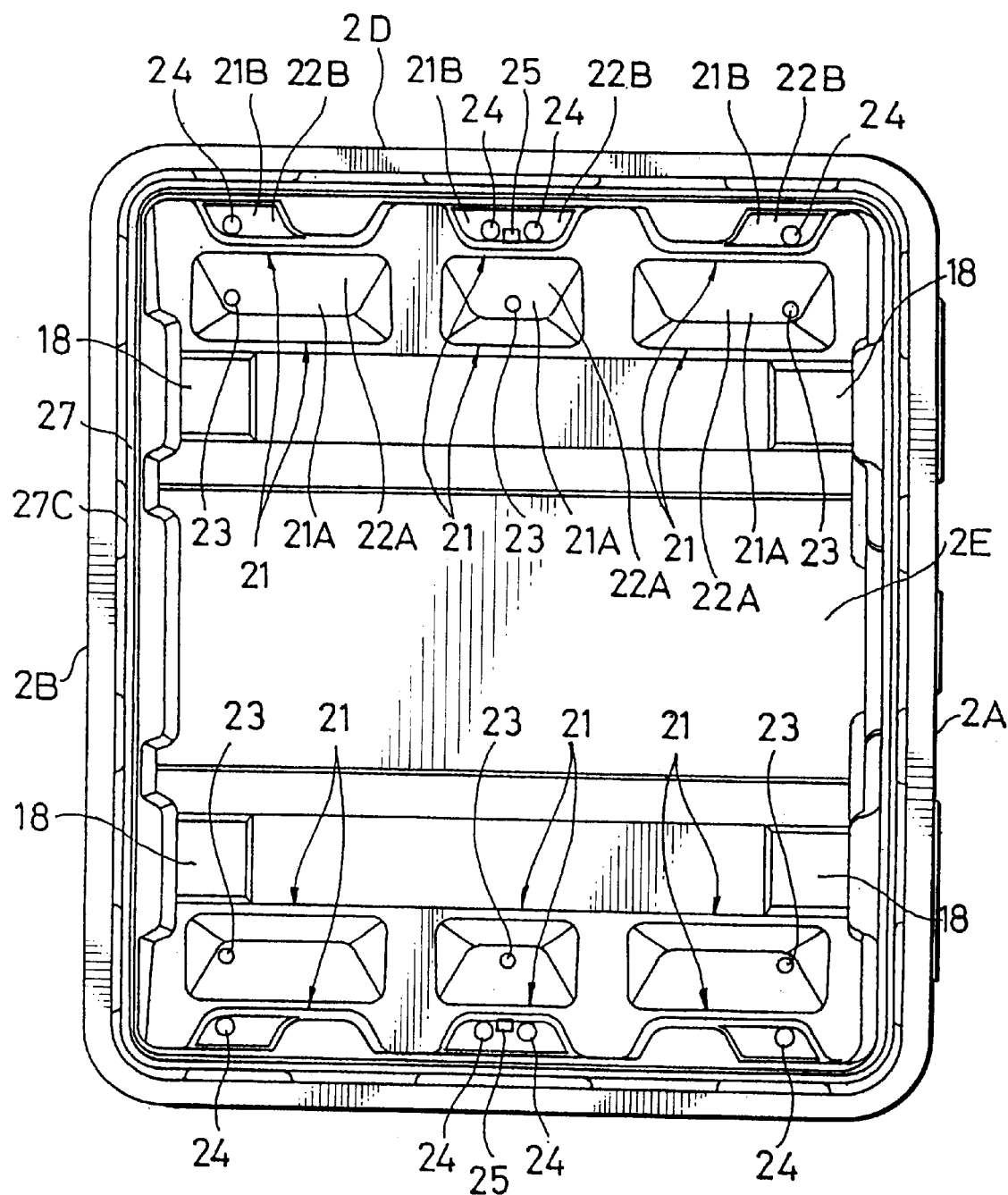
FIG. 10 is a plan view of the container body according to the embodiment of the present invention.
Figure 11:
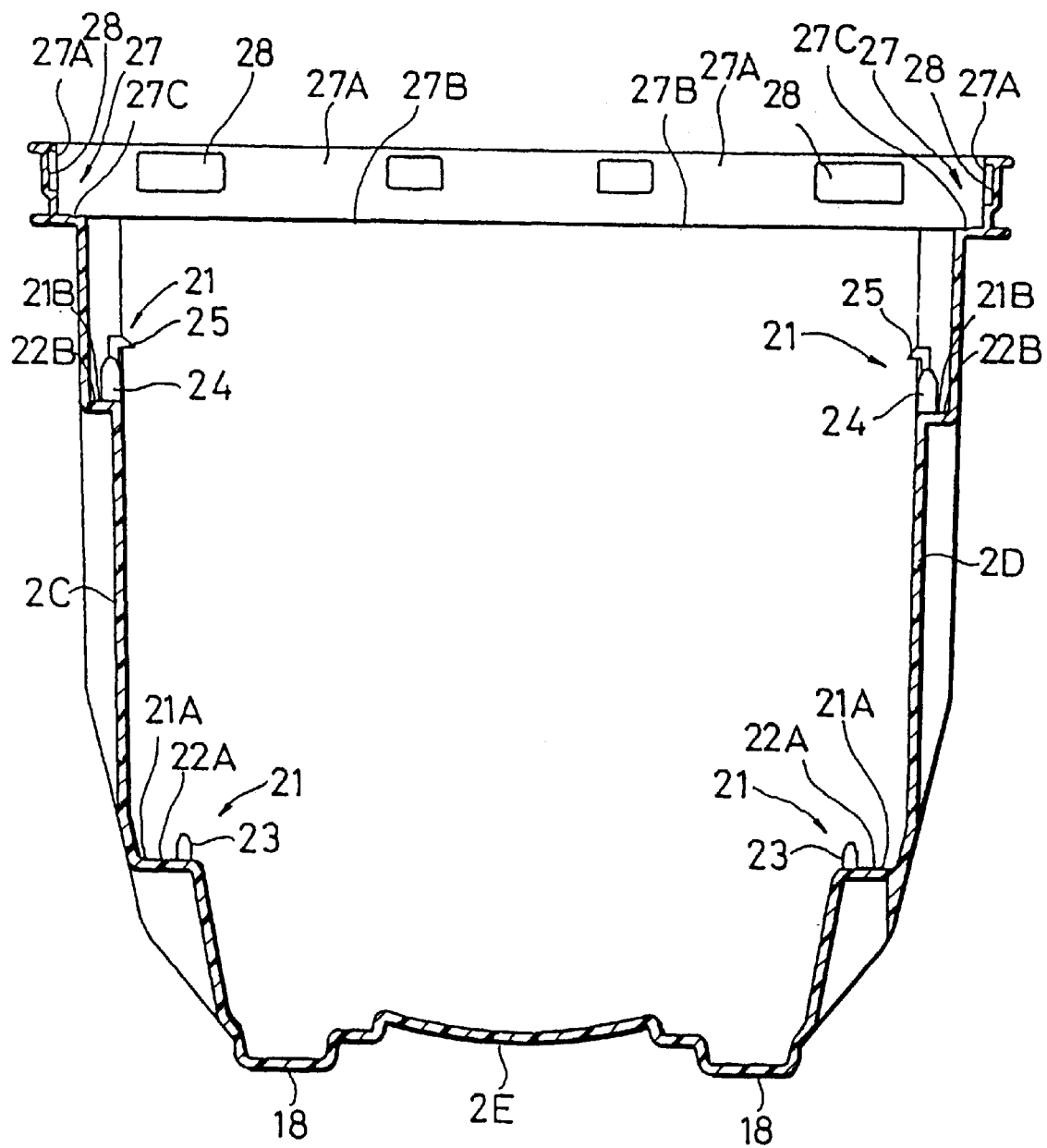
FIG. 11 is a sectional view of the elevation of the container body according to the embodiment of the present invention.

In the bottom plate 2E, there are provided legs 18 as shown in FIGS. 10 and 11. The legs 18 are formed by protruding in the shape of a rectangle downwardly four portions of the bottom plate 2E near the four corners thereof in the shape of a rectangle. The four legs 18 are adapted to stably support the container body 2 when the container body is placed in an upright position.

On the inside surface of each of the side walls 2C and 2D of the container body 2, there are provided supporting terraces 21, each for supporting a thin-plate supporting unit detachably mounted. Each supporting terrace 21 includes a lower terrace 21A and an upper terrace 21B. Each lower terrace 21A is formed by protruding each of the side walls 2C and 2D from the bottom plate 2E at three positions in the shape of a terrace. Each upper terrace 21B is formed by protruding each of the side walls 2C and 2D at three positions from each lower terrace 21A in the form of a terrace. Each of the thin plate supporting units 3 is adapted to be placed on three placement surfaces 22A of the lower terrace 21A, and on three placement surfaces of 22B of the upper terrace 21B. Further, on each of the three placement surfaces 22A of the lower terraces 21A, there is provided one lower portion supporting protrusion 23. Each lower portion supporting protrusion 23 is adapted to fit into a lower portion supporting hole (which will be described later) of each thin-plate supporting unit 3, so as to support the lower portion of the thin-plate supporting unit 3.

On each of the three placement surfaces 22B of the upper terrace 21B, there are provided upper portion supporting protrusions 24. The upper portion supporting protrusions 24 are four in number, one being provided on each of the two side upper terraces 21B, and two being provided on the central upper terrace 21B. The upper portion supporting protrusions 24 are adapted to fit into an upper portion supporting hole 40 (which will be described later) of the thin-plate supporting unit 3 so as to support the upper portion of the thin-plate supporting unit 3. Further, on the central upper terrace 21B, there is provided an engagement claw 25 at a position intermediate between the two upper portion supporting protrusions 24. The engagement claw 25 is adapted to fit into the upper portion supporting hole 40 so as to prevent the thin-plate supporting unit 3 from falling off. Specifically, in a state in which the upper portion supporting protrusions 24 fit into their corresponding upper portion supporting holes 40, the engagement claw 25 engages with an upper edge portion of the upper portion supporting hole 40 so as to secure the upper portion supporting hole 40, whereby the thin-plate supporting unit 3 is prevented from falling off.

Thus, each thin-plate supporting unit 3 is supported securely on the supporting stage 21 by means of the supporting protrusions 23 and 24, the total number of which is seven, and the engagement claw 25.

At the upper edge of the container body 2, there is provided lid receiving stage 27 into which the lid 4 fits. The lid receiving stage 27 is formed by broadening the upper edge portion of the container body 2 in conformity with the size of the lid 4. In this structure, the lid 4 is inserted among inside surfaces of upright plates 27A of the lid receiving stage 27 till the lid 4 contacts with a horizontal plate 27B, whereby the lid 4 is attached to the lid receiving stage 27. Further, along the entire circumference of the horizontal plate 27B, there is formed an annular groove 27C into which a gasket (not shown) provided on the lower surface of the lid 4 fits so as to seal the interior of the thin-plate supporting container 1. On the inner surface of the upright plate 27A, there is formed an object engagement part 28 with which a lid engagement claw 32 of an easy attach/detach mechanism 31 (which will be described later) engages so as to secure the lid 4 to the container body 2. The object engagement part 28 is formed by recessing a portion of the upright wall 27A in the shape of a rectangle, and adapted to engage with the lid engagement claw 32 at the inside upper edge thereof.

Figure 12:
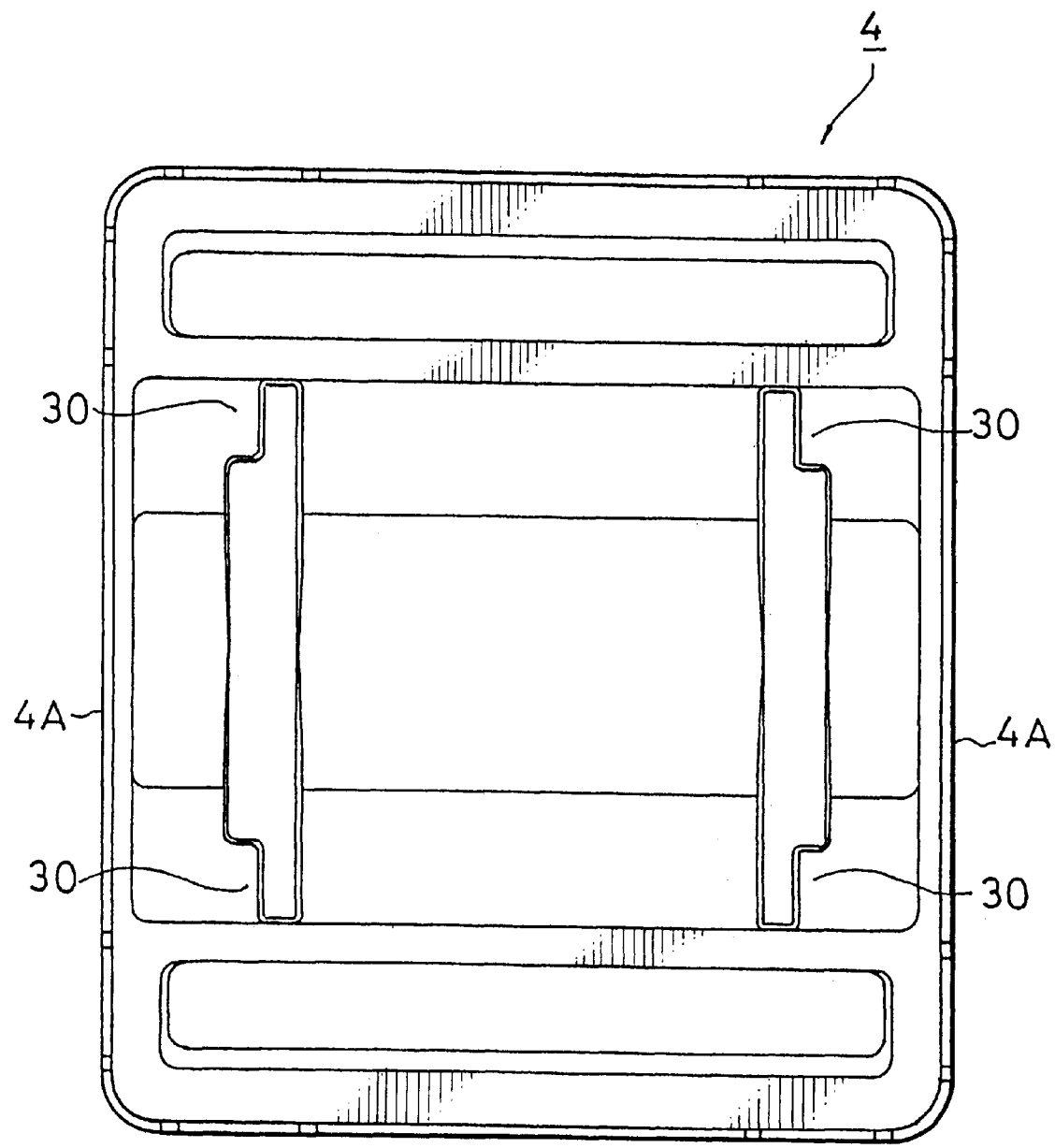
FIG. 12 is a plan view of a lid according to the embodiment of the present invention.

The lid 4 has a structure as shown in FIGS. 1 and 12. It should be noted that FIG. 12 is a plan view showing the container body 2 to which the easy attach/detach mechanism 31 (which will be described later) is not mounted.

The lid 4 has upright walls 4A along its entire circumference and is formed in the shape of a basin whose top is open. At the central portion of the lid 4, there is formed a raised portion whose cross section is formed in the shape of a circular arc so as to prevent the lid 4 from contacting with the upper portions of the semiconductor wafers housed in the container. Further, in the upper surface of the lid 4, at four positions thereof, there are formed leg receiving parts 30 into which the legs 18 formed at the bottom of the container body 2 fit.

Figure 13:
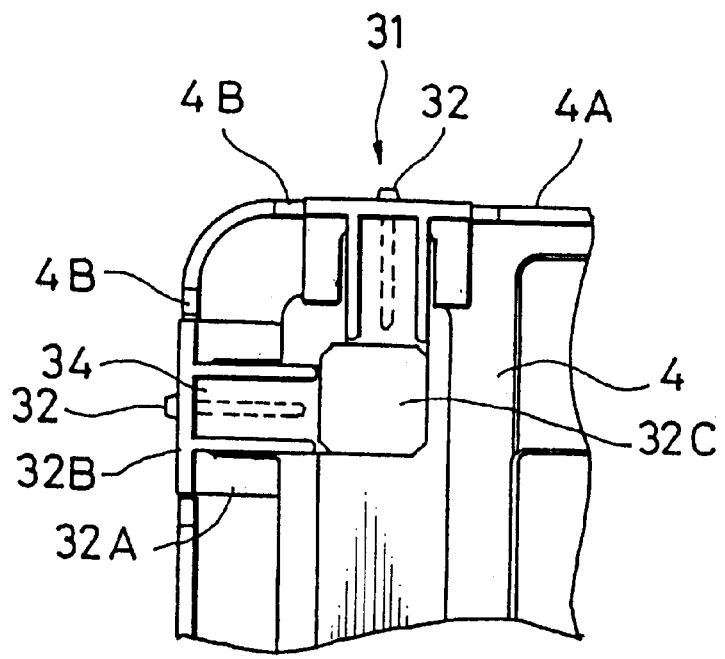
FIG. 13 is a plan view showing a part of the easy attach/detach mechanism.
Figure 14:
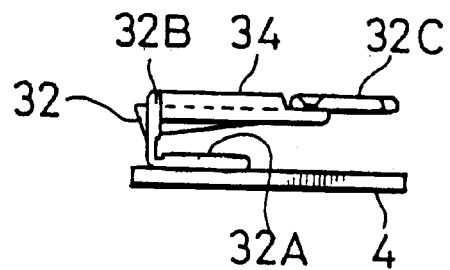
FIG. 14 is a side view of the side elevation of the easy attach/detach mechanism.
Figure 15:
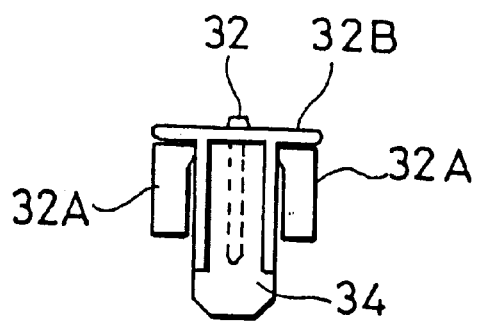
FIG. 15 is a plan view of the easy attach/detach mechanism.
Figure 16:
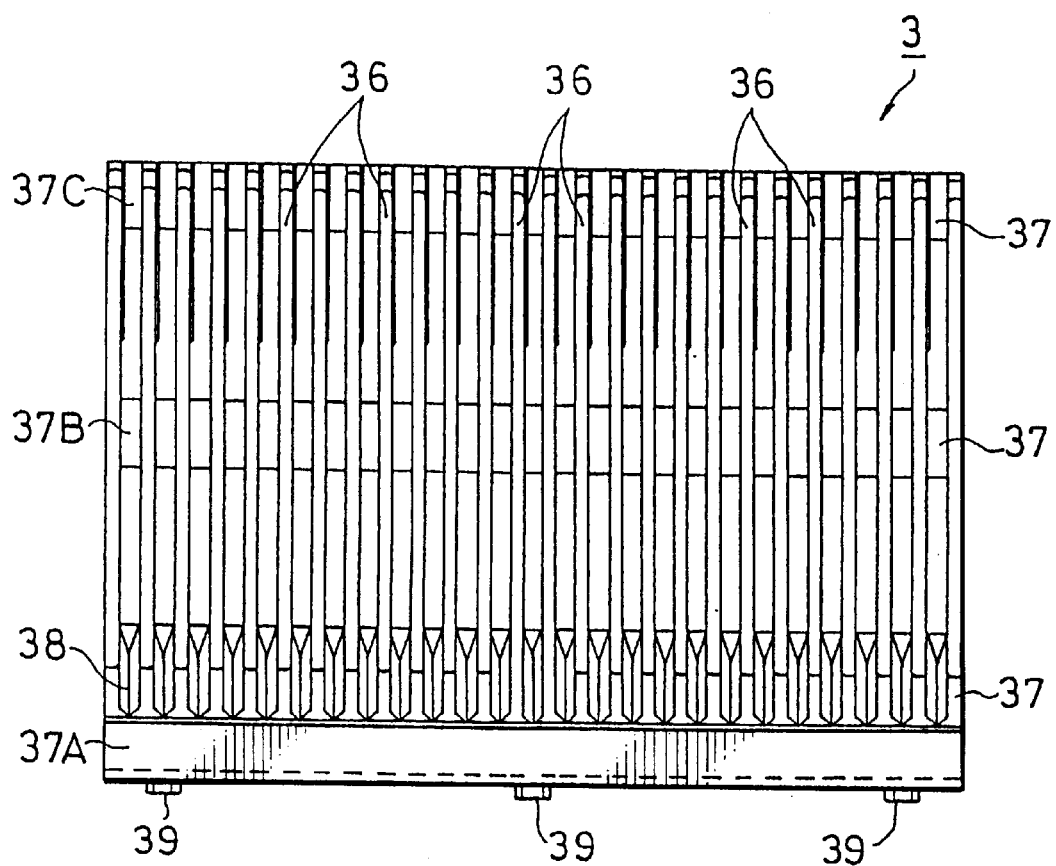
FIG. 16 is an elevational view of the thin-plate supporting unit.
Figure 17:
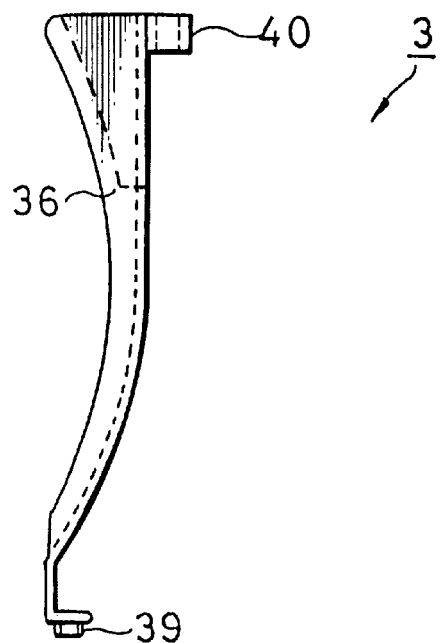
FIG. 17 is a side view of the thin-plate supporting unit.
Figure 18:
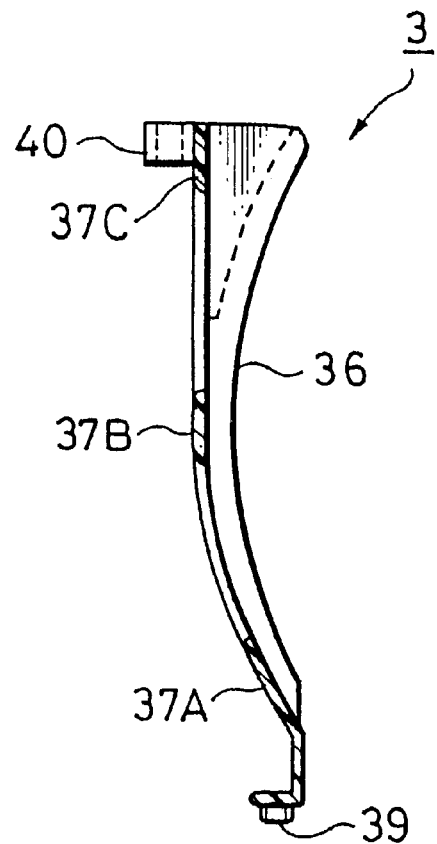
FIG. 18 is a sectional view showing the side section of the thin-plate supporting unit.
Figure 19:
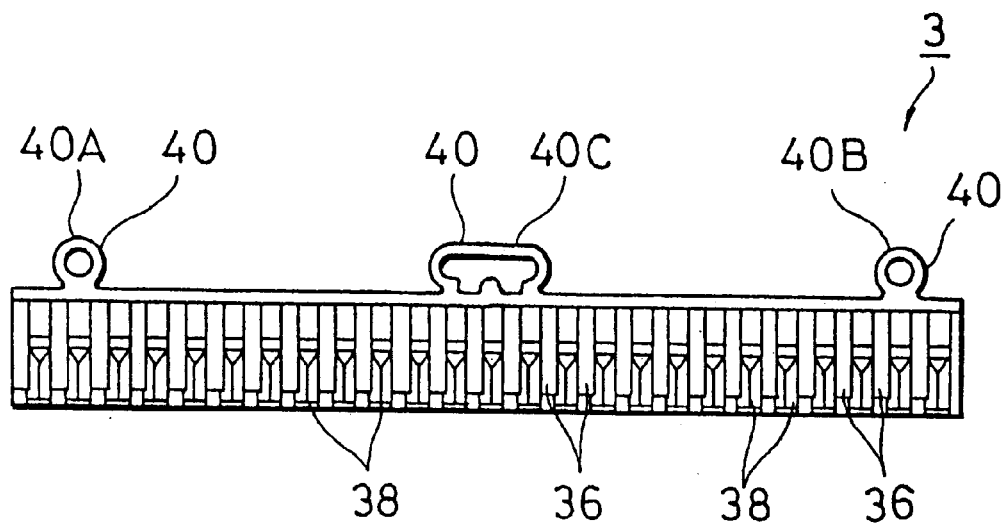
FIG. 19 is a plan view of the thin-plate supporting unit.
Figure 20:
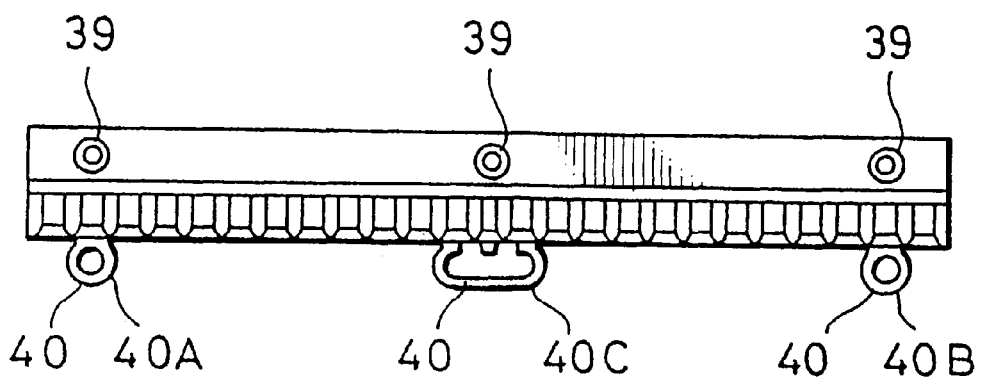
FIG. 20 is a view showing the bottom surface of the thin-plate supporting unit.
Figure 21:
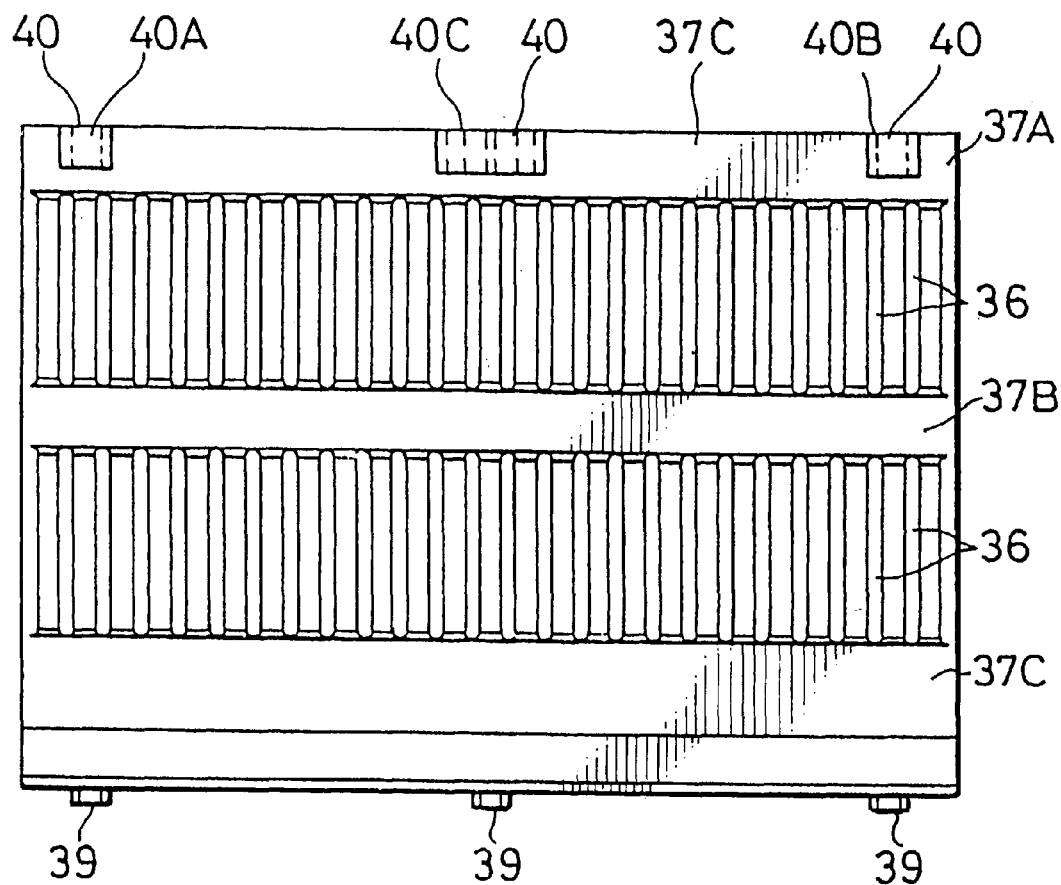
FIG. 21 is a sectional view of the rear surface of the thin plate supporting unit.

Further, at each of the four corners of the lid 4, as shown in FIGS. 13 through 15, there is provided an easy attach/detach mechanism 31 which causes the lid 4 to be detachably mounted to the container body 2. The easy attach/detach mechanism 31 generally includes: a lid engagement claw 32 which protrudes from the circumference of the lid 4 and is adapted to cause the lid 4 to be secured; the above-mentioned object engagement part 28, which is, as described above, formed in the upright wall 27A of the lid receiving stage 27 of the container body 2 in such a manner as to oppose the lid engagement claw 32; an arm 34 which is formed integrally with the lid engagement claw 32 provided on the lid 4 and adapted to disengage the lid engagement claw 32 from the object engagement part 28; and an elevating mechanism (not shown) for slightly elevating the lid 4 upward from the container body 2 when the lid engagement claw 32 is disengaged from the object engagement unit 28 by the arm 34.

The engagement claw 32 is resiliently supported by the lid 4. Specifically, as shown in FIGS. 14 and 15, the lid engagement claw 32 is formed on an upright plate 32B in such a manner as to protrude outwardly. The upright plate 32B is formed by erecting one end of a fixed plate 32A fixedly provided on the lid 4. Both of the fixed plate 32A and the upright plate 32B are formed of resilient material, and they are integrally formed. The upright plate 32B is in a resiliently bent state, so that the lid engagement claw 32 is in such a state as to be supported by the lid 4. The fixed plate 32A is fixed to the lid 4 by means of a screw or an adhesive, or by melt bonding. The arm 34 and the upright plate 32B are integrally formed, and the arm 34 extends horizontally from the upper edge of the upright plate 32B. Thereby, when the arm 34 is pressed downward, the upright plate 32B is bent, so that the lid engagement claw 32 disengages from the object engagement part 28. A member which is composed of the lid engagement claw 32, the arm 34, the fixed plate 32A and the upright plate 32B is provided at two positions in each of the four corners of the lid 4. In the upright wall 4A of the lid 4, there are provided two cutaways 4B formed by cutting off the two portions in each of the four corners. In each cutaway 4B, the member composed of the claw 32, the arm 34, the upright plate 32A and the fixed plate 32B is provided. The fore ends of the arms 34 are fixed and connected to the pressing plate 32C so that the arms 34 can be easily pressed. The fixation of the arms 34 to the pressing plate 32C is conducted by means of a screw or an adhesive, or by melt bonding, as in the case of the fixation of the plate 32A to the lid 4.

The elevating means is composed of the above-mentioned gasket, which is made of resilient material and able to slightly elevate the lid 4 upward from the container body 4.

Thereby, the lid 4 can be easily removed from the container body 2.

The thin-plate supporting unit 3 is detachably mounted on the supporting terrace 21 in the container body 2. The concrete construction of the thin-plate supporting unit 4 is shown in FIGS. 16 through 24. The thin-plate supporting unit 3 generally includes a plurality of ribs 36 which are arranged in parallel at a predetermined spacing and adapted to support the semiconductor wafers in such a manner that the individual wafers are spaced apart from each other; three supporting bars 37 which are integrally connected to and thereby support the plurality of ribs thus arranged at three positions of each rib; and a V-shaped groove 38 formed on the inner surface (surface which contacts with the semiconductor wafers) of the supporting bar 37A, which is situated at the innermost position of all the supporting bars.

Figure 22:
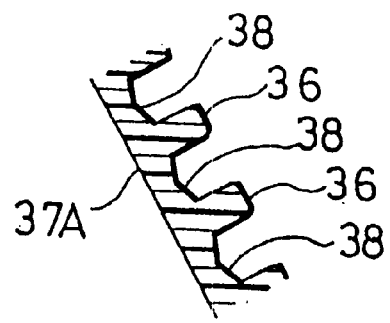
FIG. 22 is a view showing a cross section of the V-shaped groove the thin-plate supporting unit.
Figure 23:
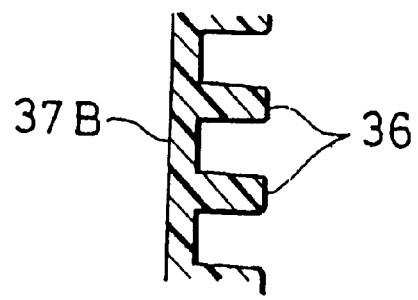
FIG. 23 is a sectional view showing an intermediate supporting bar the thin-plate supporting unit.
Figure 24:
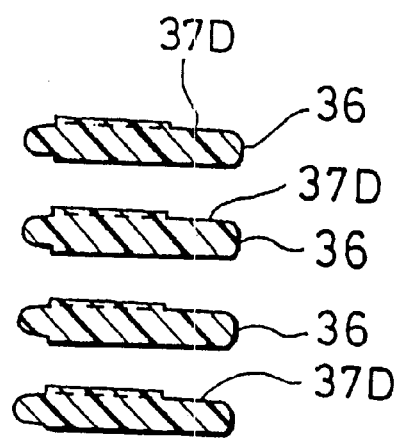
FIG. 24 is a sectional view showing the inlet-side supporting bar of the thin-plate supporting unit.
Figure 25:
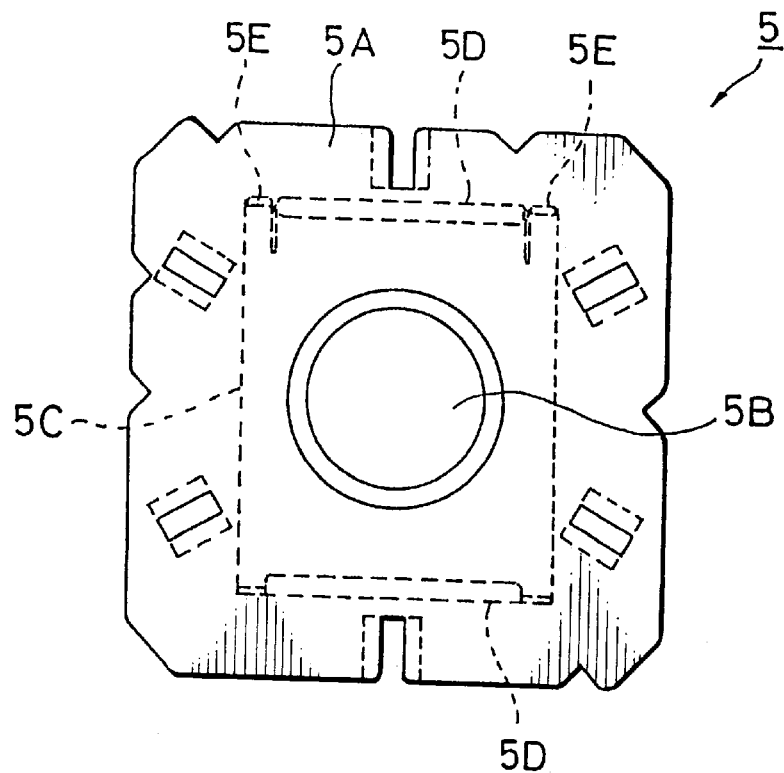
FIG. 25 is a plan view of a top flange.
Figure 26:
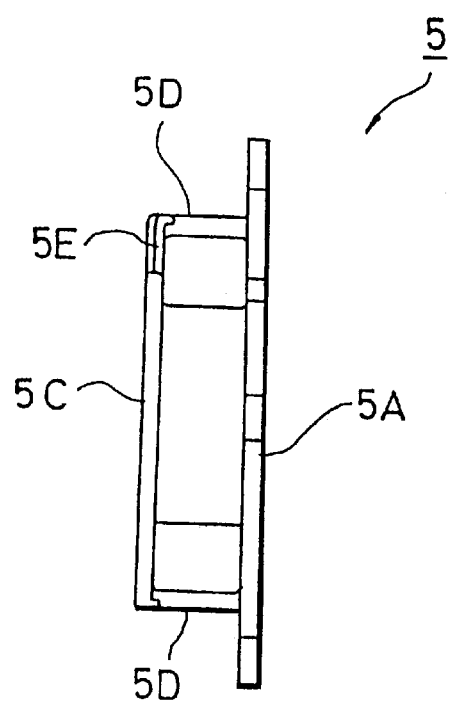
FIG. 26 is a side view of the top flange.
Figure 27:
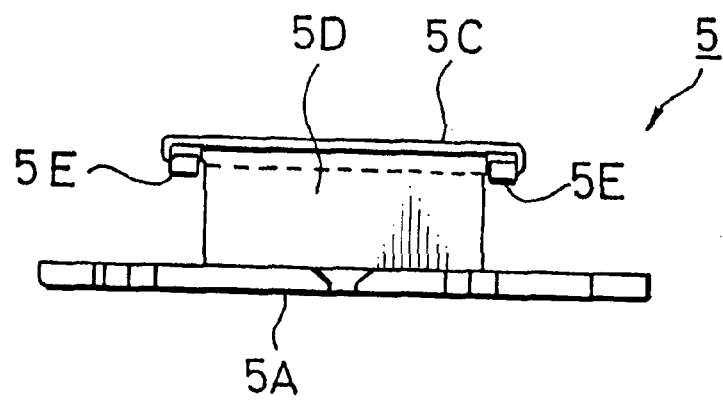
FIG. 27 is an elevational view of the top flange.
Figure 28:
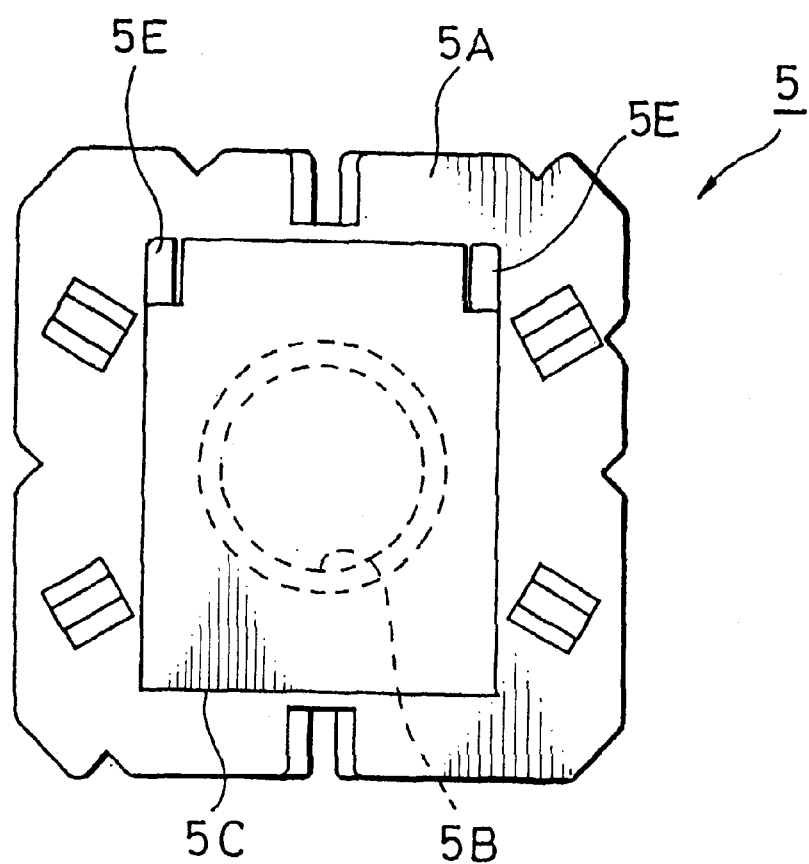
FIG. 28 is a bottom view of the top flange.
Figure 29:
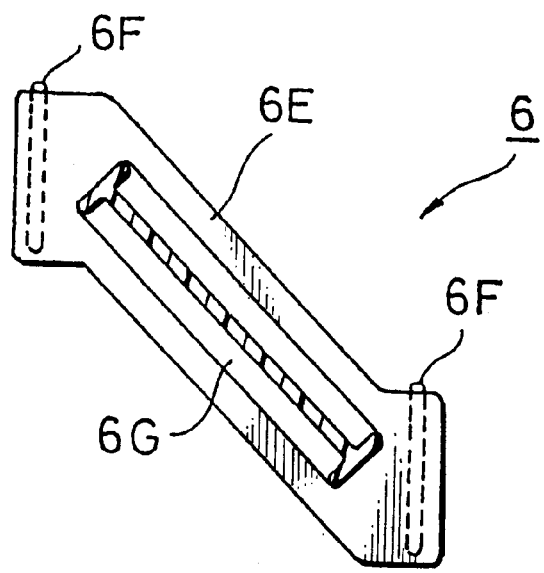
FIG. 29 is an elevational view of a carrying handle.
Figure 30:
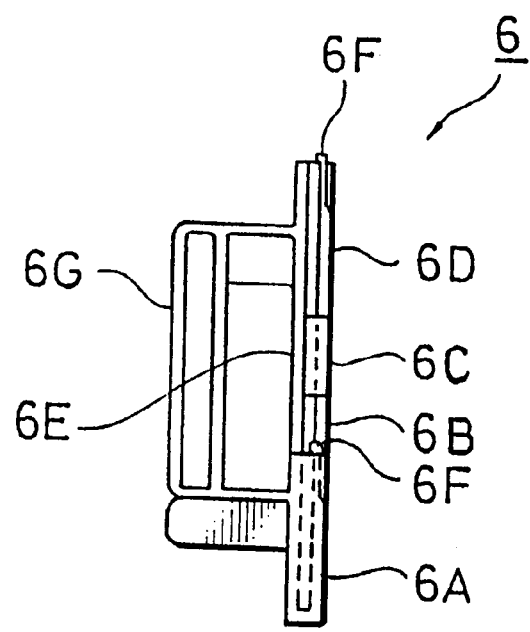
FIG. 30 is a right-side view of the carrying handle.
Figure 31:
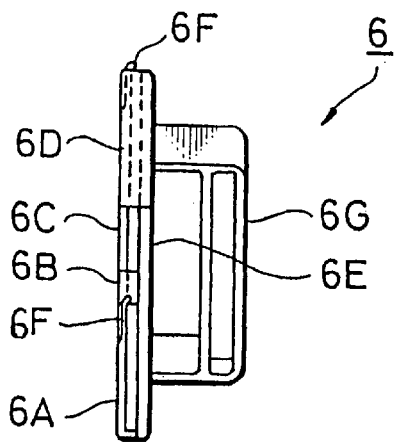
FIG. 31 is a left-side view the carrying handle.
Figure 32:
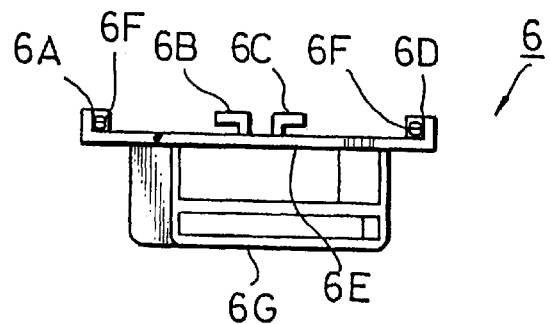
FIG. 32 is a plan view of the carrying handle.
Figure 33:
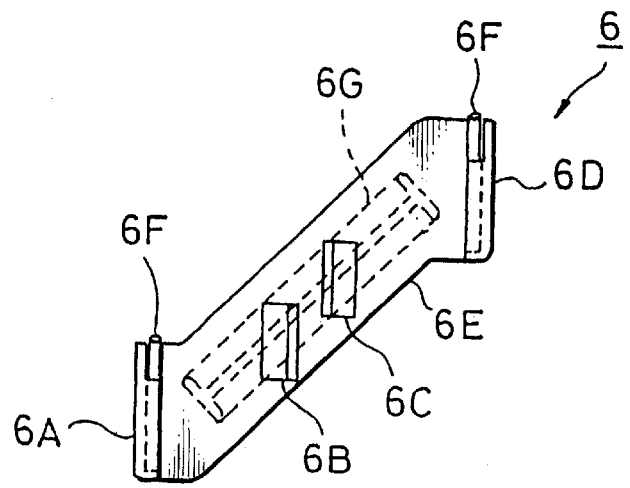
FIG. 33 is a rear view of the carrying handle.

The supporting bars 37 are integrally connected to the ribs 36 at the three positions of each rib 36, i.e., at an innermost position (at the lowest position in FIG. 16), at an intermediate position, and at an inlet-side position (at the highest position in FIG. 16), so as to support the ribs 36. Each V-shaped groove 38 has a V-shaped bottom as shown in FIG. 22. When the container body 2 is placed in a horizontal position, each V-shaped groove 38 is adapted to introduce each semiconductor wafer along its inclined surface until each semiconductor wafer falls into the bottom of the V-shaped groove, so as to support the introduced semiconductor wafer at a central position between neighboring ribs 36. The upper portions of the semiconductor wafers are supported by the upper portions of the ribs 36. Owing to this construction, neighboring semiconductor wafers are prevented from interfering with each other. The intermediate supporting bar 37B has a flat bottom as shown in FIG. 23. Further, as shown in FIG. 24, at a portion of the rib 36 near the inlet-side supporting bar 37C, there is formed a supporting stage 37D which is adapted to support a semiconductor wafer in a horizontal position when the thin-plate supporting container 1 is placed in a horizontal position. The supporting stage 37D is inclined slightly downward (for example, inclined by approximately one degree) with respect to the horizontal line so that the stage 37D can contact with the semiconductor wafer placed thereon at a smallest area.

The upper surface of the ribs 36 (the surface of the rib facing the semiconductor wafer) is warped in the shape of a circular arc along the circumferential edge of the disk-shaped semiconductor wafer. Owing to this structure, when a rib 36 supports a semiconductor wafer, the rib contacts with the semiconductor wafer at a small contacting area along the circumferential edge of the semiconductor wafer, so as to give minimized adverse effects to the surfaces of the semiconductor wafers. Specifically, the synthetic resin employed as the material of the rib 36 generates a trace amount of gas. However, since the area in which the rib 36 and the semiconductor wafer overlap each other is very small, the probability that the gas thus generated contacts with the surface of the semiconductor wafer is markedly lowered. Thereby, adverse effects which the gas gives to the surfaces of the semiconductor wafers can be reduced to the lowest extent.

Further, as the area in which the ribs 36 overlap one another seen from the direction perpendicular to the flats of the ribs 36 is also reduced, the amount of dust or the like to adhere on the surfaces of the ribs is reduced, and washing of the ribs 36 becomes easy.

On the rear surface of the thin-plate supporting unit 3, there are provided three lower portion supporting holes 39 which engage with their corresponding lower portion supporting protrusions 23 provided on the supporting terrace 21 so as to support the lower portion of the thin-plate supporting unit 3, and three upper portion supporting holes 40 which engage with their corresponding upper portion supporting protrusions 24 so as to support the upper portion of the thin-plate supporting unit 3. The three lower portion supporting holes 39, all of which are provided in the lower edge portion of the thin-plate supporting unit 3, include two side lower portion supporting holes situated at both side positions thereof and one central lower portion supporting hole situated at a central position thereof. The three lower portion supporting holes 39 are all formed in the same shape of a circle. The upper portion supporting holes 40, all of which are provided in the upper edge portion of the thin-plate supporting unit 3, include two side upper portion supporting holes 40A and 40B provided at side positions thereof and a central upper portion supporting hole 40C provided at a central position thereof. The side upper portion supporting holes 40A and 40B are both circle-shaped, while the central hole 40C is ellipse-shaped so that both of the two upper portion supporting protrusions 24 can fit into the hole 40C. Further, the engagement claw 25 engages with the upper edge of the central hole 40C so as to prevent the supporting bar 37 from slipping off from the supporting protrusions 23 and 24, whereby the supporting bar 37 is secured to the supporting protrusions 23 and 24.

The thin-plate supporting unit 3 is made of synthetic resin which has an excellent formability and can be finished at high precision. Specifically, the unit 3 is made of PBT of high purity. The other members in the container body 2 are made of inexpensive polycarbonate or the like.

The top flange 5 is adapted to be griped, when the thin-plate supporting container 1 is transferred by transfer equipment, by the arm of the transfer equipment. The top flange 5 is composed, as shown in FIGS. 25 through 28, of a flange plate 5A which is gripped by the arm of the transfer equipment, an engagement hole 5B which engages with a part of the arm, and an engagement plate 5C which engages with the flange attachment plate 14 of the container body 2 so as to attach the top flange 5 to the container body 2. At each of the fore and rear edges (the upper and lower edges in FIG. 25) of the engagement plate 5C, there is provided a connecting plate 5D for connecting the engagement plate 5C to the flange plate 5A. The engagement plate 5C has protrudent portions which protrude beyond the both ends of each connecting plate 5D. The protrudent portions are inserted behind their corresponding flange attachment plates 14 of the container body 2 (i.e. inserted into the gap formed between the flange attachment plate 14 and the flange engagement groove 15). Further, at the fore end (at the upper end in FIG. 25) of each protrudent portion of the engagement plate 5C, there is provided an engagement claw 5E. Each engagement claw 5E engages with the fore edge (upper edge in FIG. 8) of each flange attachment plate 14 so as to prevent the top flange 5 from slipping out. The top flange 5, having been attached to the flange attachment plates 14, can be easily detached from the flange attachment plates 14 merely by disengaging the engagement claws 5E from the flange attachment plate 14.

The carrying handle 6 is a handle which the operator grips when he carries the thin-plate supporting container 1 with his hand. The carrying handle 6 is composed, as shown in FIGS. 29 through 33, of: an engagement plate 6E including engagement pieces 6A, 6B, 6C and 6D which respectively engage with the four plate pieces 16A, 16B, 16C and 16D of the container body 2; an engagement claw 6F formed on each of the engagement pieces 6A and 6D, which are two outermost ones of the four engagement pieces 6A, 6B, 6C and 6D; and gripping portion 6G. Each of the engagement pieces 6A, 6B, 6C and 6D is inclined by 45 degrees with respect to the engagement plate 6E. Thereby, when the four engagement pieces 6A, 6B, 6C and 6D are inserted in parallel into the four plate pieces 16A, 16B, 16C and 16D, which are arranged in the upper-right direction with an angle of 45 degrees with respect to the engagement plate 6E, the carrying handle 6 is attached to the container body 2 in such a position as to be inclined by 45 degrees to the container body 2. At this occasion, the engagement claws 6F engage respectively with the fore edges of the outermost plate pieces 16A and 16D while the base ends of the outermost engagement pieces 6A and 6D, which close in the form of a bag, engage with the base edges of the outermost plate pieces 16A and 16D, whereby the handle attachment plate 16 is secured to the container body 2. Further, when the handle attachment plate 16 is removed from the container body 2, only by disengaging the engagement claws 6F from the fore edges of the outermost plate pieces 16A and 16B and displacing the handle attachment plate 16, the engagement pieces 6A, 6B, 6C and 6D are disengaged from their corresponding plate pieces 16A, 16B, 16C and 16D, whereby the handle attachment plate 16 can be easily removed from the container body 2.

The carrying handle 6 having the above-mentioned structure is prepared for two pieces which are symmetrical with each other, and the two carrying handles 6 thus prepared are attached on the respective side walls 2C and 2D.

The filter 7 is adapted to adjust the internal atmospheric pressure of the thin-plate supporting container 1. The filter 7 is mounted to either the container body 2 or the lid 4 of the thin-plate supporting container 1 and adapted to allow gas to pass therethrough between the outside and inside of the thin-plate supporting container 1 while prohibiting dust or the like from passing therethrough. Thereby, the internal atmospheric pressure of the thin-plate supporting container 1 is adjusted to its optimum value while keeping the interior of the container 1 clean, so that the lid 4 is prevented from becoming difficult to open.

Figure 34:
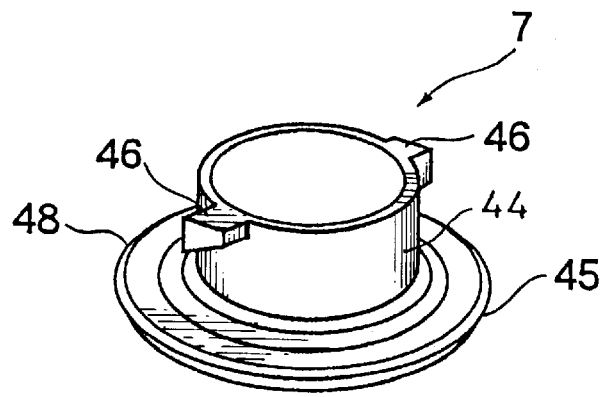
FIG. 34 is a perspective view of the filter.
Figure 35:
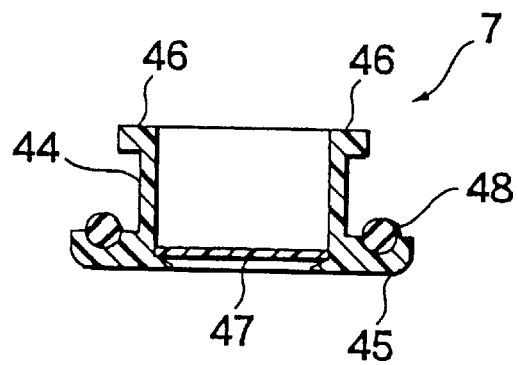
FIG. 35 is a sectional view of the filter.
Figure 36:
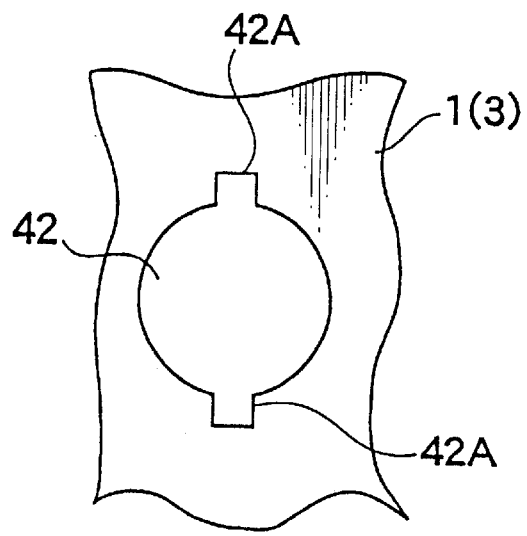
FIG. 36 is a plan view of an opening to which the filter is attached.

The filter 7 has a concrete structure as shown in FIGS. 34 through 36. The filter 7 is provided at an optional position which lies in either the container body 2 or the lid 4 of the thin-plate supporting container 1 and does not spoil the other functions.

Reference numeral 42 denotes an opening formed in either the container body 2 or the lid 4 of the thin-plate supporting container 1. The opening 42 is formed by boring a circular hole by which the interior and exterior spaces of the thin-plate supporting container 1 are connected to each other. Thereby, the opening 42 allows gas to pass therethrough between the inside and outside of the thin-plate supporting container 1 so as to equalize the internal and external atmospheric pressures of the container. On the both ends (on the upper and lower positions in FIG. 36) of the opening 42, there are provided cuts 42A for receiving the engagement claws 46 of the filter 7 (which will be described, later).

When gas comes into and goes out of the thin-plate supporting container 1 through the opening 42, the filter 7 allows only gas to pass therethrough while removing dust or the like contained in the external gas. The filter 7 has a performance of a degree to which the dust or the like can be removed and gas can pass therethrough. In other words, the performance of the filter 7 is set to a degree to which, when gas passes through the opening 42 between the outside and inside of the thin-plate supporting container 1, the filter 7 does not give resistance to the passage of the gas and allows the gas to easily pass therethrough. The filter 7 includes a cylinder body 44, a flange 45, an engagement claw 46 and filtering material 47, as shown in FIGS. 34 and 35.

The cylinder body 44 has a cylindrical shape, and has a diameter substantially equal to the inside diameter of the opening 42.

The flange portion 45 is provided at one end of the cylinder body 44 (in the lower part of the drawing) and adapted to contact with one surface of the region defining the opening 42 in a state in which the cylinder body 44 fits in the opening 42. On the inside surface of the flange portion 45, there is provided an annular gasket 48. In a state in which the cylinder body 44 fits in the opening 42, and the flange portion 45 abutting contacts with the edge region defining the opening, the gasket 48 pressingly contacts with the flange portion 45 and with the edge region defining the opening 42 so as to tightly seal therebetween.

The engagement claws 46 are provided at two positions at the other end of the cylinder body 44 in such a manner that the two engagement claws extend in opposite directions. Each engagement claw 46 has a wedge-shaped cross section. Specifically, the surface of each engagement claw 46 facing the flange portion 45 is inclined. Owing to this structure, when the cylinder body 44 is inserted into the opening 42, while aligning the engagement claws 46 with the cuts 42A, and then the filter 7 is rotated, the inclined surfaces of the engagement claws 46 are brought into pressing contact with the other surface of the opening edge region defining the opening 42, whereby the filter 7 is secured to the thin-plate supporting container 1.

The filtering material 27 is provided on the inner surface of the cylinder body 44 and adapted to remove dust or the like from the gas passing through the cylinder body 44. Specifically, when gas around the thin-plate supporting container 1 flows into the thin-plate supporting container 1 through the opening 42, the filtering material 47 is adapted to remove the dust or the like and to allow only the gas to pass. The performance of the filtering material 47 is set to the degree to which gas can pass smoothly while dust or the like is removed. Specifically, the filtering material 47 is so constructed that, when gas passes through the opening 42 between the outside and inside of the thin-plate supporting container 1, the gas can pass easily while the filtering material 47 does not generate too much resistance to the passage of the gas. Accordingly, the gas passes through the filtering material easily so that the container 1 can cope with even abrupt change in the atmospheric pressure around the container 1.

The thin-plate supporting container 1 having the above structure is used in the following manner.

When the semiconductor wafers are housed in the container body 2, while placing the container body 2 in a horizontal position, semiconductor wafers are introduced from the open top 2F by a wafer transfer robot. At this occasion, the semiconductor wafers are each inserted and thereby placed between the ribs 36 of the thin-plate supporting unit 3.

After housing the semiconductor wafers are placed in the container 1, when the container 1 is transferred, the container body 2 is placed in an upright position manually by the operator with the carrying handle 6 in his hand, or automatically by the robot with the top flange 5 gripped in the hand of the robot. At this time, the semiconductor wafers abutting contact with and are supported by the V-shaped grooves 38 of the ribs 36. Specifically, each semiconductor wafer is first placed on the inclined surface of each V-shaped groove 38, then guided along the inclined surface till it falls into the groove bottom, and finally supported at the central position between neighboring ribs 36. The upper portions of the semiconductor wafers are supported by the upper portions of the ribs 36. Thereby, the semiconductor wafers are securely prevented from interfering with each other.

Subsequently, the lid 4 is attached to the lid receiving stage 27 of the container body 2 in the above-mentioned manual or automatic manner so that the open top 2F of the container body 2 is covered with the lid 4. Subsequently, the lid 4 is pressed from above. Thereby, the upright plate 32B of the easy attach/detach mechanism 31 is bent so that the lid engagement claw 32 engages with the object engagement part 28, whereby the lid 4 is secured to the container body 2. In this state, when the thin-plate supporting container 1 is packed before transferring, the top flange 5 and the carrying handle 6 are removed. Specifically, the engagement claws 5E and 5F are disengaged, and the top flange 5 and the carrying handle 6 are displaced and removed. Thereby, the thin-plate supporting container 1 can be packed compactly. At this occasion, the top flange 5 and the carrying handle 6 are packed together with the thin-plate supporting container 1.

Meanwhile, during the transfer of the thin-plate supporting container 1, there are some cases where the atmospheric pressure around the container 1 changes. In such cases, the filter 7 operates to equalize the internal and external atmospheric pressures of the thin-plate supporting container 1 while prohibiting dust or the like entering the container 1. Thereby, the internal and external atmospheric pressures of the container 1 can be always kept equal. This eliminates the phenomenon that, at the time when the lid 4 of the thin-plate supporting container 1 is opened, the internal atmospheric pressure becomes lower than the external atmospheric pressure and thereby the lid 4 becomes difficult to open.

During the transfer or storage, there are some cases where the thin-plate supporting containers 1 are stacked one on another. In such cases, the containers 1 are stacked in such a state that the legs 18 of the thin-plate supporting container 1, which is stacked on, fits into the leg receiving part 30 of the thin-plate supporting container 1, which is stacked under. Thereby, a plurality of thin-plate supporting containers 1 can be stacked in a stable state.

When the package is undone and the thin-plate supporting container 1 is handled, the top flange 5 and the carrying handle 6 are attached by one-time attachment. When the operator handles the thin-plate supporting container 1, he may change, with the carrying handle 6 in his hand, the position of the container 1 from the upright position to the horizontal position, or from the horizontal position to the upright position. In such a case, since the carrying handle 6 is disposed at an angle of 45 degrees, he does not need to turn his wrist in an unnatural manner, so that the operability or usability of the container 1 is greatly enhanced.

When the lid 4 is removed from the container body 2, the pressing plate 32C is pressed downward in the above-mentioned manual or automatic manner. Thereby, the upright plate 32B is bent by means of the arm portion 34. In accompaniment of this action, the lid engagement claw 32 disengages from the object engagement part 28, whereby the lid 4 having been secured to the container body 2 is released therefrom. Thereby, the gasket operates to slightly elevate the lid 4 from the container body 2. As a result, the lid 4 is released from the container body 2. Thereafter, the lid 4 is lifted and then removed from the container body 2 in the above-mentioned manual or automatic manner, and then the semiconductor wafers housed in the container body 2 are taken out.

If the number, dimension, or the other features of the semiconductor wafers to be handled is changed, a suitable type of the thin-plate supporting unit 3 is selected in accordance with the features of the wafers, and attached to the supporting terrace 21 of the container body 2. The attachment of the thin-plate supporting unit 3 is performed by engaging the lower supporting holes 39 and upper supporting holes 40 of the thin-plate supporting unit 3 with their corresponding lower supporting protrusions 23 and upper supporting protrusions 24 of supporting terrace 21. It should be noted that a plurality of the thin-plate supporting units 3 are previously prepared in accordance with the number, a dimension, or the other features of the semiconductor wafers to be handled.

Further, for the thin-plate supporting unit, there are prepared previously a plurality of types in which the number or arrangement of spacings of the thin plate to be housed or the distance between opposing thin-plate supporting units are appropriately changed, and one of the types is selected in accordance with the dimension, the number and so on of the thin plates to be housed, and the thin-plate supporting unit 3 of the type thus selected is used. Thereby, the operator can easily and promptly cope with various situations in which the carrier is used.

The thin-plate supporting container 1 is washed after the transfer or the like operation is completed. When the container 1 is washed, the thin-plate supporting unit 3 having been attached to the container body 2 is detached. Further, the filter 7 is also detached. Then, they are washed separately. Therefore, the container body 2 and the thin-plate supporting unit 3 can be easily and sufficiently washed to every small portion thereof. Furthermore, the filter 7 can be washed efficiently.

As described above, since the easy attach/detach mechanism 31 is provided on the lid 4, the lid 4 can be attached to or detached from the container body 2 in an extremely easy manner. The easy attachment/detachment of the lid 4 can be realized regardless of whether the attachment/detachment is performed manually or automatically.

Further, since the legs 18 are provided in the container body 2 while the leg receiving part 30 is provided in the lid 4, a plurality of thin-plate supporting containers 1 can be stacked in a stable manner Further, since the thin-plate supporting unit 3 is detachably attached to the container body 2, when the thin-plate supporting unit 3 is detached, the container body 2 and the thin-plate supporting container 3 can be washed easily and sufficiently to every small portion thereof.

Further, if a plurality of types of the thin-plate supporting unit 3, in which the number of the semiconductor wafers to be supported, arrangement of the spacing between the wafers, and distances between opposing thin-plate supporting units 3 are appropriately varied, are prepared, the operator can cope with various situations in which the number, the dimension, or the other features of the semiconductor wafers to be handled are different.

Further, since the V-shaped groove 38 is formed in a supporting bar 37 of the thin-plate supporting unit 3, when a semiconductor wafer is placed in the V-shaped groove 38, the semiconductor wafer is guided along the inclined surface of the V-shaped groove 38 to the grove bottom thereof. Thereby, at the innermost portion, the semiconductor wafer is supported at a central position intermediate between the neighboring ribs 36, so that interference between the neighboring semiconductor wafers can be securely prevented.

Further, since each rib 36 is formed in the shape of a circular arc in accordance with the shape of a semiconductor wafer, the area in which the rib 36 and the semiconductor wafer are in slight contact with each other is reduced to a small value, thus eliminating adverse effects applied on the surface of the thin plate (semiconductor wafer).

Further, since precision in the dimensions of the thin-plate supporting unit 3 is kept high, the semiconductors can be securely supported, and also neighboring semiconductor wafers can be prevented from interfering with each other during the transfer of the container 1.

Further, since the top flange 5 and the carrying handle 6 are detachably mounted, if they are detached when the thin-plate supporting container 1 is transferred, the container can be compactly packed instead of becoming bulky, so that efficiency of the transfer of the container 1 can be enhanced.

Further, the carrying handle 6 is attached in such a manner as to be directed in the direction intermediate between the vertical and horizontal directions, that is, in such a manner as to be inclined by 45 degrees. Owing to this structure, the operator does not need to turn his wrist to an extreme extent when he changes the position of the thin-plate supporting container 1, with the carrying handle 6 in his hand, from the upright position to the horizontal position, or from the horizontal position to the upright position. As a result, burdens imposed on the operator are markedly reduced so that usability of the container 1 is greatly enhanced.

Further, since the filter 7 is provided in the thin-plate supporting container 1, the filter 7 operates to adjust the internal pressure of the thin-plate container 1 to an optimum value even when the atmospheric pressure changes during the transfer of the thin-plate container 1. This prevents the occurrence of a phenomenon that the lid 4 becomes difficult to remove.

Further, since the filter 7 is detachably mounted, the filter 7 can be detached and washed efficiently when the thin-plate supporting container 1 needs to be washed.

In the above-mentioned embodiment, the present invention is described by employing a semiconductor wafer as an example. However, when the present invention is applied to cases in which other thin plates, such as storage disks, liquid crystal glass substrates or the like, are employed, the same operations and advantages as exhibited in the above-mentioned embodiment are obtained. It should be noted that, in the case of a liquid crystal glass substrate, since the liquid crystal substrate is formed in the shape of a rectangle, the thin-plate supporting unit 3 is formed in such a shape as to conform thereto.

In the above-mentioned embodiment, the detachably attached thin-plate supporting unit 3 is used for the thin-plate supporting container 1 whose interior is sealed by the lid 4. However, the unit 3 may be used for a wafer carrier, which is used for chemical liquid treatment or washing in the production line and so on. In other words, the same operations and advantages are also obtained when the detachably attached thin-plate supporting unit 3 is used for the wafer carrier.

While in the above-mentioned embodiment the carrying handle 6 is attached in such a manner as to be inclined by 45 degrees, the inclined angle is not limited thereto. So long as the inclined angle is an angle approximate to 45 degrees, the same operations and advantages as in the above-mentioned embodiment can be obtained.

In the above-mentioned embodiment, in order to reduce the contacting area between the rib 36 and the semiconductor wafer to a minimum value, the supporting stage portion 37D is formed at the inlet side of each rib 36 in such a manner as to be slightly inclined downward. Alternatively, a wafer supporting portion in the form of a protrusion may be provided at a portion which the semiconductor wafer contact for this purpose.

While in the above-mentioned embodiment the gasket was employed as the elevating mechanism, the elevating mechanism may be formed of another resilient member, such as a spring or the like.

While in the above-mentioned embodiment PBT of high purity is employed as the material for the thin-plate supporting unit 3, the thin-plate supporting unit 3 may be formed of PEEK (polyetheretherketone), PBN (polybutylene naphthalate) or the like.

Further, while in the above-mentioned embodiment, the bottom portion of the V-shaped groove 38 is formed at an exact central position displaced equally from neighboring ribs 36, the position of the V-shaped groove 38 is not limited thereto. So long as the bottom portion of the V-shaped groove 38 is formed in the vicinity of the central position, the same operations and advantages can be obtained as in the above-mentioned embodiment.

Further, the shape of the V-shaped groove 38 is not limited to a sharp V-shape, but may be a gentle V-shape. Further, the inclined surface of the V-shaped groove 38 is not limited to a plane surface but may be slightly curved inwardly or outwardly so long as the shape of the inclined surface operates to guide the semiconductor wafers or the like to the groove bottom portion.

As described above in detail, the thin-plate housing container of the present invention exhibits the following advantages.

(1) Since the easy attach/detach mechanism is provided on the lid, the lid can be attached to or detached from the container body very easily. Further, the attachment and detachment of the lid can be performed easily regardless of whether the lid is operated manually or automatically.

(2) Since the leg is provided in the container body while the leg receiving part is provided in the lid, a plurality of thin-plate supporting container can be stacked one on another in a stable manner.

(3) Since the thin-plate supporting unit is detachably attached to the container body, the thin-plate supporting unit can be removed so that the container body and the thin-plate supporting unit can be washed easily and sufficiently to every small portion. Further, if as to the thin-plate supporting unit, there are previously prepared a plurality of types in which the number of the thin plates to be housed, the arrangement of the spacings therebetween, or the distance between the opposing thin-plate supporting units are varied, the operator can cope easily and swiftly with various situations in which the dimensions of the thin plates, the number of thin plates thus housed, and so on are different.

(4) Further, since the V-shaped groove is formed in the supporting bar, the semiconductor wafers are supported at the central positions between neighboring ribs, so that the thin plates can be reliably prevented from interfering with each other.

(5) Further, since the rib is formed in the shape of a circular arc in accordance with the shape of the thin plates, the area in which the rib and the thin plate are in slight contact with each other is reduced to a small value, which eliminates the adverse effect caused by the rib applied to the surfaces of the thin plates.

(6) Since the precision in the dimension of the thin-plate supporting unit can be kept high, the thin plate can be supported reliably, and neighboring thin plates can be prevented from interfering with each other during transfer or the like operation of the container.

(7) Since the top flange and the carrying handle are detachably attached, when these members are detached during the transportation of the thin-plate supporting container, the container does not become bulky but can be packed compactly, so that efficiency of transferring operations can be enhanced.

(8) Since the carrying handle is attached in such an inclined position directed in the direction intermediate between the vertical and horizontal directions of the container body, the operator does not need to turn his wrist to an extreme extent when he changes the position of the thin-plate supporting container, with the carrier handle in his hand, from the upright position to the horizontal position, or from the horizontal position to the upright position, whereby burdens imposed on the operator is reduced so that the container becomes easy to operate.

(9) Further, since the filter is provided in the thin-plate supporting container, even when the atmospheric pressure changes greatly during transportation of the thin-plate supporting container, the filter operates to adjust the internal atmospheric pressure of the thin-plate supporting container to an optimum value. This prevents the occurrence of a phenomenon that the lid becomes difficult to open.

(10) Further, since the filter is detachably attached, when the thin-plate supporting container is washed, the washing can be performed efficiently by removing the filter.

Industrial Applicability

As described above, the thin-plate supporting container 1 according to the present invention can be used for a carrier for transferring semiconductor wafers, hard memory disks (magnetic disks), substrates of compact disks. (CD), or the like, in which dust or the like must be completely prevented from generating. Further, the container 1 can be used for a carrier used for the manufacturing process therefor.

What is claimed is:

1. A thin-plate supporting container comprising:
a container body for housing therein a plurality of thin plates, said container comprising four side walls and a bottom wall integral therewith, said side walls extending from said bottom wall and terminating at an opening at the top of said container body when said container body is in an upright position;
a plurality of thin-plate supporting units, provided on interior opposing side walls of the container body, for supporting the thin plates thus housed from opposing sides thereof;

a lid, completely separable from the container body, for covering the container body to provide a top surface which is horizontal with the container in its upright position; and at least one attach/detach mechanism for attaching the lid to and detaching the lid from the container body, each attach/detach mechanism comprising:

an engagement element fixed to the lid at an outer peripheral portion of the lid;

an engagement element receiver which is provided on the container body in a first of said side walls at a position where it mates with the engagement element and is adapted to receive the engagement element so as to secure the lid to the container body; and an operating arm which is integral with the engagement element, which is resiliently biased toward a rest position where it is parallel to said top surface, and which, when pressed perpendicularly toward said top surface, moves the engagement element parallel to said top surface and toward a second of said side walls, opposite said first side wall, to remove the engagement element from the engagement element receiver and to allow the lid to be lifted perpendicularly away from said bottom wall and parallel to movement of said operating arm toward said top surface and thereby separated from the container body.

2. The thin-plate supporting container according to claim 1, further comprising:

a leg, provided at the lower portion of the container body, for stably supporting the container body when in its upright position; and a leg receiving part, formed in the upper surface of the lid, for receiving the leg.

3. The thin-plate supporting container according to claim 1, further comprising:

a top flange for engagement by an arm of a transfer device, and a carrying handle, said top flange and said carrying handle being detachably attached to the container body.

4. The thin-plate supporting container according to claim 3, wherein said carrying handle is attached in an inclined position so as to be oriented in a direction intermediate between the vertical and horizontal directions with the container body in its upright position.

5. The thin-plate supporting container according to claim 1, further comprising:

a filter, provided on one of the container body and the lid, for allowing gas to pass therethrough so as to equalize the internal and external pressures while inhibiting dust or like from passing therethrough.

6. The thin-plate supporting container according to claim 1 wherein said attach/detach mechanism further comprises:

an upright plate which extends perpendicular to said lid from a fixed end fixed to said lid to a free end integrally joined to said operating arm at a predetermined angle; and a protrusion extending from said free end, opposite said operating arm and forming said engagement element, whereby said free end and said protrusion move integrally with said operating arm when said operating arm is pressed perpendicularly toward said top surface of said lid.

7. The thin-plate supporting container according to claim 6 wherein the predetermined angle is approximately 90°.

8. The thin-plate supporting container according to claim 1 further comprising:

an elastic member for slightly elevating the lid to separate the lid from the container responsive to the release of said engagement element from said engagement element receiver.

9. The thin-plate supporting container according to claim 1 wherein said container body comprises:

an annular shoulder portion joined to upper ends of the side walls and providing a receiving surface for receiving said lid, said receiving surface being approximately parallel to said bottom wall; and a vertical wall portion joined to an outer periphery of said annular shoulder portion, said engagement element receiver being formed in said vertical wall portion.

10. The thin-plate supporting container according to claim 9 wherein said engagement element receiver is a recess in said vertical wall portion.

11. The thin-plate supporting container of claim 9 further comprising:

an elastomeric gasket mounted on said receiving surface for slightly elevating the lid to separate the lid from the container responsive to release of said engagement element from said engagement element receiver.

12. A thin-plate supporting container according to claim 1 wherein each of said thin-plate supporting units comprises:

a plurality of ribs arranged in parallel at a predetermined spacing, perpendicular to said bottom wall, and serving as shelves supporting the plurality of thin plates individually when the thin plates are horizontal, said ribs being defined by a supporting surface, an opposing surface and an edge, said supporting surface and said opposing surface of each rib extending from a side wall to the edge, said edge having the shape of a circular arc extending from a bottom end adjacent said bottom wall to a top end adjacent said opening, said supporting surface and said opposing surface having a maximum dimension, perpendicular to the side wall from which they depend, at said top end.

13. A thin-plate supporting container according to claim 1 wherein said lid has four sides joining at four corners and wherein at least one said attach/detach mechanism is mounted at each of two of said sides opposite each other.

14. A thin-plate supporting container comprising:

a container body for housing therein a plurality of thin plates, said container body comprising four side walls and a bottom wall integral therewith, said side walls extending from said bottom wall and terminating at an opening at the top of said container body when said container body is in an upright position;

a plurality of thin-plate supporting units, provided on interior opposing side walls of the container body, for supporting the thin plates thus housed from opposing sides thereof;

a lid, completely separable from the container body, for covering the container body to provide a top surface which is horizontal with the container in its upright position; and at least one attach/detach mechanism for attaching the lid to and detaching the lid from the container body, each attach/detach mechanism comprising:

an upright plate extending perpendicular to the top surface of said lid, from a fixed end fixed to the lid, at an outer peripheral portion of the lid, to a free end;

a fixing arm integrally joined with said fixed end of said upright plate at an angle of approximately 90° and fixed to said top surface of said lid;

an engagement element in the form of a protrusion extending from said upright plate;

an engagement element receiver which is provided on the container body in a first of said side walls at a position where it mates with the engagement element and is adapted to receive the engagement element so as to secure the lid to the container body; and an operating arm which is integral with the engagement element, which is resiliently biased toward a rest position where it is parallel with said top surface and with said fixing arm, and which, when pressed perpendicularly toward said top surface, moves the engagement element parallel to said top surface and toward a second of said side walls, opposite said first side wall, to remove the engagement element from the engagement element receiver and to allow the lid to be lifted perpendicularly away from said bottom wall and parallel to movement of said operating arm toward said top surface and to be thereby separated from the container body.

15. The thin-plate supporting container according to claim 14 wherein said fixing arm and said operating arm are parallel to said horizontal top surface.

16. A thin-plate supporting container comprising:

a container body for housing therein a plurality of thin plates, said container body comprising four side walls and a bottom wall integral therewith, said side walls extending from said bottom wall and terminating at an opening at the top of said container body when said container body is in an upright position;

a plurality of thin-plate supporting units, provided on interior opposing side walls of the container body, for supporting the thin plates thus housed from opposing sides thereof;

a lid, completely separable from the container body, for covering the container body to provide a top surface which is horizontal with the container in its upright position; and at least one attach/detach mechanism for attaching the lid to and detaching the lid from the container body, each attach/detach mechanism comprising:

an engagement element fixed to the lid at an outer peripheral portion of the lid;

an engagement element receiver which is provided on the container body in a first of said side walls at a position where it mates with the engagement element and is adapted to receive the engagement element so as to secure the lid to the container body; and an operating arm which is integral with the engagement element, which is resiliently biased toward a rest position where it is parallel to said top surface, and which, when pressed perpendicularly toward said top surface, moves the engagement element parallel to said top surface and toward a second of said side walls, opposite said first side wall, to remove the engagement element from the engagement element receiver and to allow the lid to be lifted perpendicularly away from said bottom wall and parallel to movement of said operating arm toward said top surface and thereby separated from the container body; and wherein said lid has four sides joining at four corners, wherein a pair of said operating arms are mounted on said lid at each of said four corners, with a first operating arm of one pair being integral with and perpendicular to a first upright plate having a protrusion extending therefrom and latching in said engagement element receiver in said first side wall of said container body and a second operating arm of said one pair being integral with and perpendicular to a second upright plate having a protrusion extending therefrom and latching in another engagement element receiver in a second side wall of said container body, and wherein the first and second operating arms of said one pair are joined at a pressing plate so that they can be operated together by pressing said pressing plate.

17. A thin-plate supporting container comprising:

a container body for housing therein a plurality of thin plates, said container comprising four side walls and a bottom wall integral therewith, said side walls extending from said bottom wall and terminating at an opening at the top of said container body when said container body is in an upright position;

a plurality of ribs depending from each of two opposing side walls of said container body, the ribs of each plurality being arranged in parallel at a predetermined spacing and perpendicular to said bottom wall, and serving as shelves supporting the plurality of thin plates individually when the plates are horizontal, said ribs being defined by a supporting surface, an opposing surface and an edge, said supporting surface and said opposing surface of each rib extending from a side wall to the edge, said edge having the shape of a circular arc extending from a bottom end adjacent said bottom wall to a top end adjacent said opening, said supporting surface and said opposing surface having a maximum dimension, perpendicular to the side wall from which they depend, at said top end.

18. The thin-plate supporting container according to claim 17 wherein for each of said ribs the supporting surface is tapered toward the opposing surface so that each rib is thinnest at said edge, whereby a disk horizontally supported by the supporting surface has only an edge in contact with the supporting surface.

19. A thin-plate supporting container according to claim 17 further comprising:

a thin-plate supporting unit, detachably and separately mounted on and supported by each of the two opposing side walls of the container body, one of the pluralities of said ribs being formed on each of said thin-plate supporting units.

20. A thin-plate supporting container according to claim 19 wherein each of the thin-plate supporting units comprises:

said one plurality of ribs;

a plurality of supporting bars arranged perpendicular to, integrally connected with and supporting said one plurality of ribs, said supporting bars being arranged in parallel at a predetermined spacing; and V-shaped grooves providing abutting contact surfaces for supporting the thin plates on edge, said V-shaped grooves being formed in a supporting bar closest to said bottom end and adapted to guide, when the container body is placed with said opening up, each thin plate to the center between a pair of adjacent ribs.

21. A thin-plate supporting container according to claim 17 wherein said supporting surface of each rib has, at its top end adjacent said opening, a raised section presenting a shoulder surface extending perpendicular to said supporting surface and recessed from said edge, said shoulder surface having a circular arc shape.

* * * * *